US 6,749,906 B2

United States Patent
Van Slyke

(10) Patent No.: US 6,749,906 B2
(45) Date of Patent: Jun. 15, 2004

(54) THERMAL PHYSICAL VAPOR DEPOSITION APPARATUS WITH DETACHABLE VAPOR SOURCE(S) AND METHOD

(75) Inventor: Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 167 days.

(21) Appl. No.: 10/131,926

(22) Filed: Apr. 25, 2002

(65) Prior Publication Data

US 2003/0203638 A1 Oct. 30, 2003

(51) Int. Cl.[7] .................................................. H05B 6/02

(52) U.S. Cl. .......................... 427/591; 118/50; 118/50.1; 118/58; 118/600; 118/620; 118/641; 118/719; 118/724; 118/726; 118/733; 427/58; 427/255.3; 427/294; 427/457

(58) Field of Search .......................... 118/50, 600, 50.1, 118/58, 620, 641, 719, 724, 726, 733; 427/58, 255.3, 294, 457, 591

(56) References Cited

U.S. PATENT DOCUMENTS

| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 5,550,066 A | 8/1996 | Tang et al. |
| 6,237,529 B1 | 5/2001 | Spahn |
| 2001/0006827 A1 | 7/2001 | Yamazaki et al. |

FOREIGN PATENT DOCUMENTS

WO    01/31081 A1   5/2001

*Primary Examiner*—Bernard Pianalto
(74) *Attorney, Agent, or Firm*—Raymond L. Owens

(57) ABSTRACT

A thermal physical vapor deposition apparatus includes an elongated vapor distributor disposed in a chamber held at reduced pressure, and spaced from a structure which is to receive an organic layer in forming part of an OLED. One or more detachable organic material vapor sources are disposed outside of the chamber, and a vapor transport device including a valve sealingly connects each attached vapor source to the vapor distributor. During vapor deposition of the organic layer, the structure is moved with respect to the vapor distributor to provide an organic layer of improved uniformity on the structure.

36 Claims, 16 Drawing Sheets

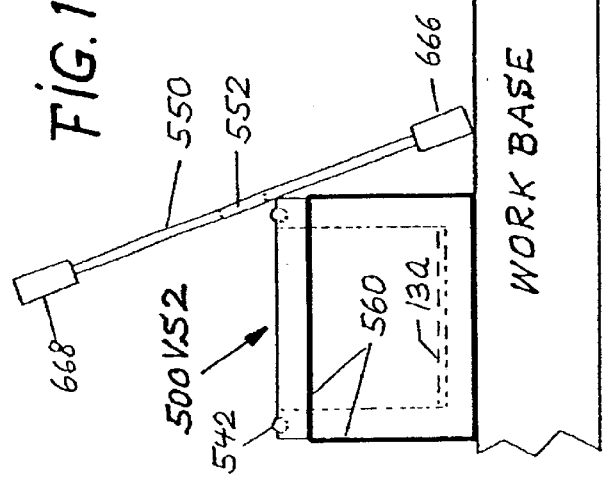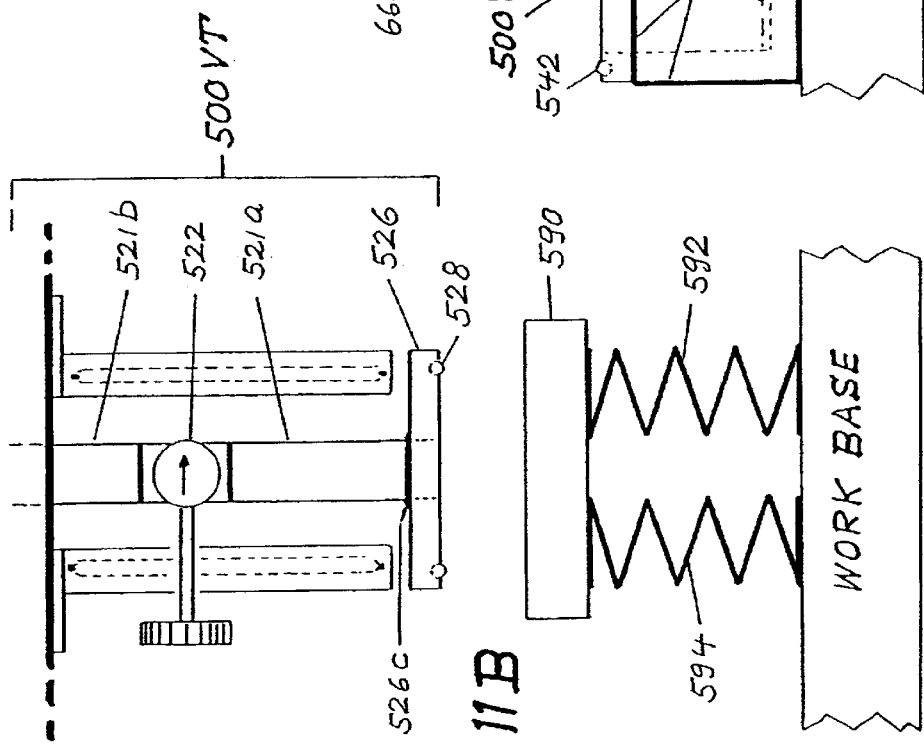

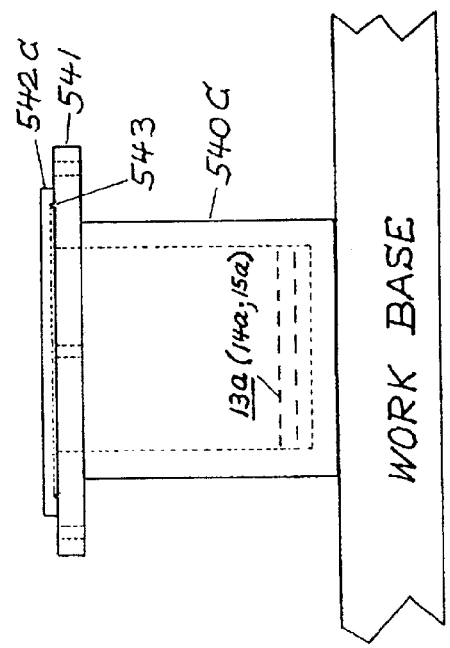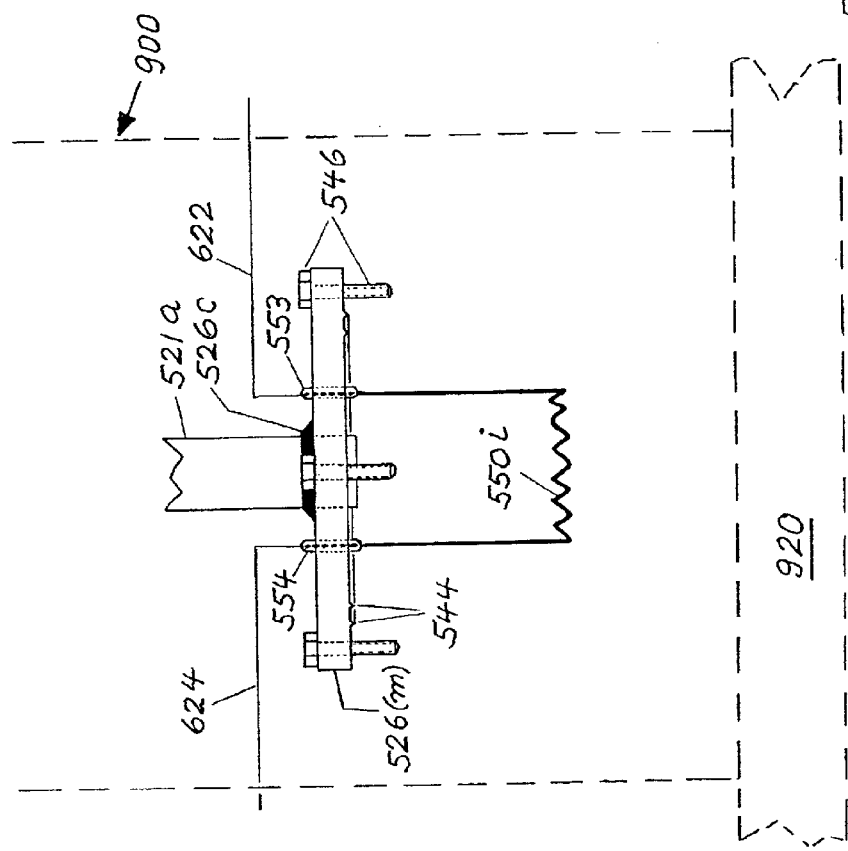

THERMAL PHYSICAL VAPOR DEPOSITION APPARATUS WITH DETACHABLE VAPOR SOURCE(S) AND METHOD

FIELD OF THE INVENTION

The present invention relates generally to vapor deposition onto a structure of an organic layer which will form part of an organic light-emitting device (OLED). More particularly, the present invention relates to a thermal physical vapor deposition apparatus which includes an elongated vapor distributor disposed in a chamber at reduced pressure and spaced from a structure, one or more detachable organic material vapor sources disposed outside of the chamber, and a vapor transport device connecting each vapor source to the vapor distributor.

BACKGROUND OF THE INVENTION

An organic light-emitting device, also referred to as an organic electroluminescent device, can be constructed by sandwiching two or more organic layers between first and second electrodes.

In a passive matrix organic light-emitting device (OLED) of conventional construction, a plurality of laterally spaced light-transmissive anodes, for example indium-tin-oxide (ITO) anodes, are formed as first electrodes on a light-transmissive substrate such as, for example, a glass substrate. Two or more organic layers are then formed successively by vapor deposition of respective organic materials from respective sources, within a chamber held at reduced pressure, typically less than $10^{-3}$ torr ($1.33 \times 10^{-1}$ pascal). A plurality of laterally spaced cathodes is deposited as second electrodes over an uppermost one of the organic layers. The cathodes are oriented at an angle, typically at a right angle, with respect to the anodes.

Applying an electrical potential (also referred to as a drive voltage) operates such conventional passive matrix organic light-emitting devices between appropriate columns (anodes) and, sequentially, each row (cathode). When a cathode is biased negatively with respect to an anode, light is emitted from a pixel defined by an overlap area of the cathode and the anode, and emitted light reaches an observer through the anode and the substrate.

In an active matrix organic light-emitting device (OLED), an array of anodes are provided as first electrodes by thin-film transistors (TFTs) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in U.S. Pat. Nos. 4,356,429, 4,539,507, 4,720,432, and 4,769,292, the disclosures of which are herein incorporated by reference.

In past and current practice of forming a vapor-deposited organic layer on an OLED substrate or structure, a vapor deposition source is disposed in a chamber which is evacuated to provide a reduced pressure as low as $10^{-6}$ torr ($1.33 \times 10^{-4}$ pascal). The OLED substrate or structure is also disposed in the chamber and spaced from the vapor deposition source. The source has received, prior to evacuation of the chamber, solid organic material which can be vaporized. When the source is operative, a portion of the solid organic material is vaporized, generally by sublimation, and vapor of organic material condenses on the OLED substrate or structure to form an organic layer.

A particular problem arises from using a vapor deposition source which is disposed in an evacuated chamber: when the solid organic material in the source has been depleted or used up after multiple substrates or structures have been coated with an organic layer, the chamber has to be vented to atmospheric pressure so that the chamber can be opened for removal and/or replacement of the depleted source, or to recharge the source with solid organic material. Such venting, and subsequent evacuation of the chamber, can be time-consuming because opening the chamber to the ambient atmosphere can result in adsorption of moisture in the chamber and its internal components. It is well known in the art of vacuum system technology that such adsorbed moisture can significantly increase the time required to evacuate a chamber to achieve the reduced pressure in the chamber which had been maintained prior to venting and opening the chamber to the ambient environment.

This problem may be compounded in a multi-chamber apparatus which is evacuated by a common vacuum pump facility to achieve a reduced pressure in each chamber of such apparatus or system.

SUMMARY OF THE INVENTION

It is an object of the present invention to overcome the problems associated with using a vapor deposition source charged with a solid organic OLED material in a chamber at reduced pressure.

It is another object of the present invention to use one or more detachable organic material vapor sources in making OLED devices.

This object is achieved in a thermal physical vapor deposition apparatus for vaporizing solid organic materials and applying vaporized organic materials as an organic layer onto structure in a chamber at reduced pressure in forming a part of an organic light-emitting device (OLED), comprising:

a) an elongated vapor distributor disposed in the chamber and spaced from the structure, the vapor distributor defining an elongated cavity having a plurality of vapor efflux apertures formed along an elongated direction of the distributor for delivering vaporized organic materials in the space between the distributor and the structure for depositing an organic layer onto the structure;

b) one or more detachable organic material vapor sources which are disposed outside of the chamber and can be attached, and when operative, to deliver vaporized organic materials into the cavity of the vapor distributor; and c) a vapor transport device dedicated to each of the one or more organic material vapor sources and sealingly extending into the cavity, the vapor transport device including means for detaching or for sealingly attaching an organic material vapor source.

ADVANTAGES

A feature of the present invention is that one or more organic material vapor sources are disposed outside of a chamber held at a reduced pressure and can be detached from a vapor transport device which extends into a vapor distributor disposed in the chamber while maintaining the reduced pressure in the chamber.

Another feature of the present invention is that a plurality of detachable organic material vapor sources which are disposed outside of a chamber held at a reduced pressure can be charged with solid organic materials selected to provide vapors to a vapor distributor disposed in the chamber via a corresponding plurality of vapor transport devices, so that an organic layer of an OLED can be formed on a structure with the layer having selected features.

Another feature of the present invention is that an organic layer of an OLED of improved uniformity can be formed on a structure by providing motion of the structure with respect to a vapor distributor during vapor deposition of the layer.

BRIEF DESCRIPTION OF THE DRAWINGS

FIGS. 11A, 11B, and 11C depict schematically another embodiment of a detachable vapor source in accordance with a further aspect of the present invention and showing compression springs for sealingly attaching a vapor source to a vapor transport device and for detaching the source from the device, wherein FIG. 11A shows the vapor source sealingly attached to a vapor transport device by compressed compression springs;

FIG. 11B shows the vapor source removed or detached from the vapor transport device and the compression springs in a relaxed or uncompressed condition; and FIG. 11C shows the detached vapor source and the planar vaporization heater;

FIGS. 12A, 12B, and 12C show schematically another embodiment of a detachable vapor source in accordance with a further aspect of the present invention and including an immersion vaporization heater, a flanged container, and a metal gasket for providing sealing engagement between the container and a source cover, wherein:

FIG. 12A shows the vapor source and the associated vapor transport device disposed in a heatable enclosure;

FIG. 12B shows the source cover and the immersion vaporization heater disposed in the enclosure; and FIG. 12C shows the detached container positioned on a work base in preparation for replenishing vaporizable organic material.

DETAILED DESCRIPTION OF THE INVENTION

The drawings are necessarily of a schematic nature since layer thickness dimensions of OLEDs are frequently in the sub-micrometer ranges, while features representing lateral device dimensions can be in a range of 50–500 millimeter. Furthermore, the plurality of vapor efflux apertures formed in the vapor distributor are relatively small in size when compared to a length dimension over which the apertures extend along the elongated direction of the distributor. Accordingly, the drawings are scaled for ease of visualization rather than for dimensional accuracy.

The term "substrate" denotes a light-transmissive support having a plurality of laterally spaced first electrodes (anodes) preformed thereon, such substrate being a precursor of a passive matrix OLED. The term "structure" is used to describe the substrate once it has received a portion of a vapor deposited organic layer, and to denote an active matrix array as a distinction over a passive matrix precursor.

Figure 1:
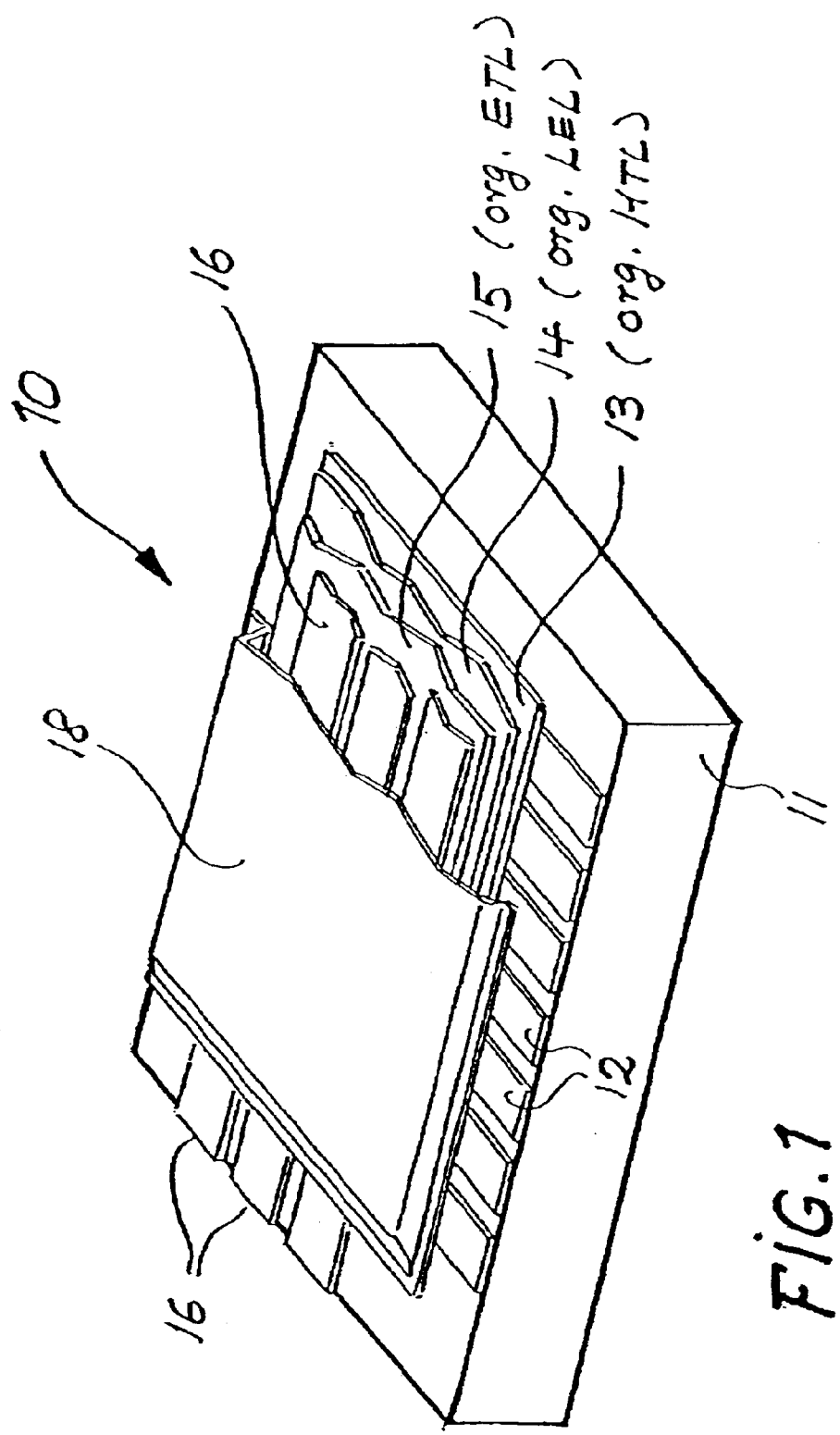
FIG. 1 is a schematic perspective view of a passive matrix organic light-emitting device having partially peeled-back elements to reveal various layers.

Turning to FIG. 1, a schematic perspective view of a passive matrix organic light-emitting device (OLED) 10 is shown having partially peeled-back elements to reveal various layers.

A light-transmissive substrate 11 has formed thereon a plurality of laterally spaced first electrodes 12 (also referred to as anodes). An organic hole-transporting layer (HTL) 13, an organic light-emitting layer (LEL) 14, and an organic electron-transporting layer (ETL) 15 are formed in sequence by a physical vapor deposition, as will be described in more detail hereinafter. A plurality of laterally spaced second electrodes 16 (also referred to as cathodes) are formed over the organic electron-transporting layer 15, and in a direction substantially perpendicular to the first electrodes 12. An encapsulation or cover 18 seals environmentally sensitive portions of the structure, thereby providing a completed OLED 10.

Figure 2:
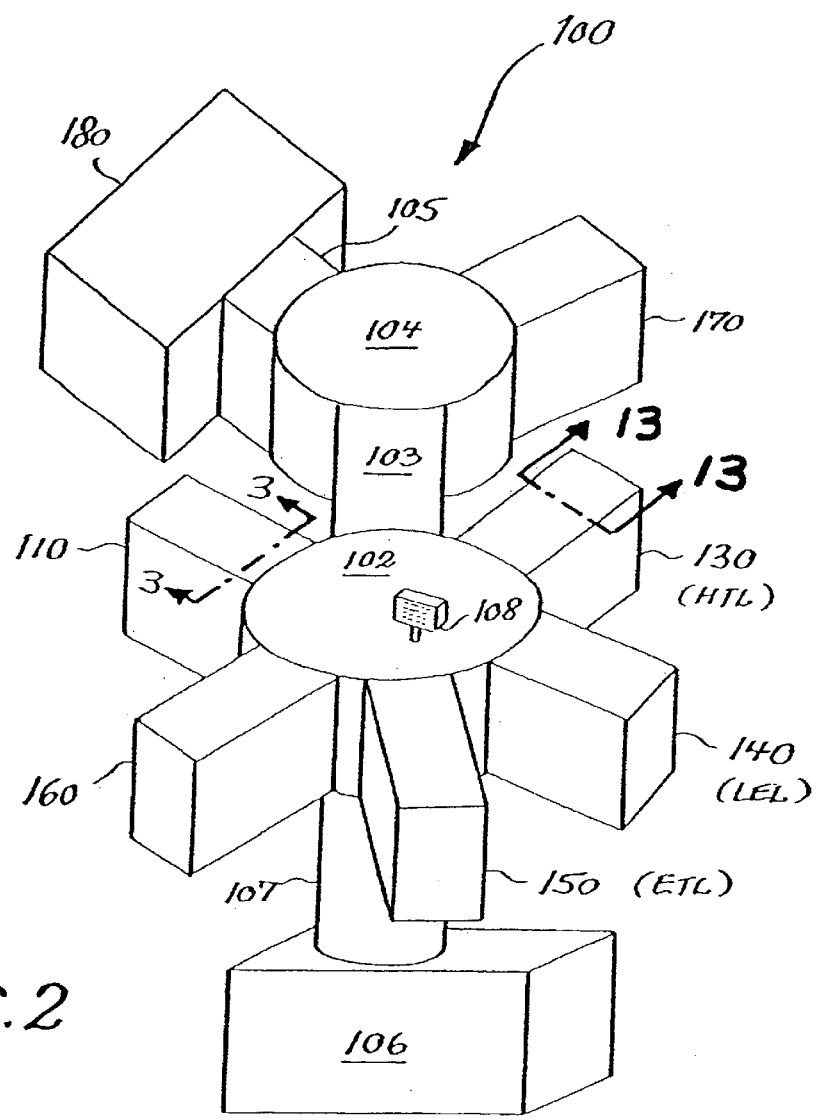
FIG. 2 is a schematic perspective view of an OLED apparatus suitable for making a relatively large number of organic light-emitting devices (OLEDs) and having a plurality of stations extending from hubs.

Turning to FIG. 2, a schematic perspective view of an OLED apparatus 100 is shown which is suitable for making a relatively large number of organic light-emitting devices using automated or robotic means (not shown) for transporting or transferring substrates or structures among a plurality of stations extending from a buffer hub 102 and from a transfer hub 104. A vacuum pump 106 via a pumping port 107 provides reduced pressure within the hubs 102, 104, and within each of the stations extending from these hubs. A pressure gauge 108 indicates the reduced pressure within the system 100. The pressure is typically lower than $10^{-3}$ torr ($1.33 \times 10^{-1}$ pascal) and can be as low as $10^{-6}$ torr ($1.33 \times 10^{-4}$ pascal).

The stations include a load station 110 for providing a load of substrates or structures, a vapor deposition station 130 dedicated to forming organic hole-transporting layers (HTL) which may include organic hole-injecting sub-layers, a vapor deposition station 140 dedicated to forming organic light-emitting layers (LEL), a vapor deposition station 150 dedicated to forming organic electron-transporting layers (ETL), a vapor deposition station 160 dedicated to forming the plurality of second electrodes (cathodes), an unload station 103 for transferring structures from the buffer hub 102 to the transfer hub 104 which, in turn, provides a storage station 170, and an encapsulation station 180 connected to the hub 104 via a connector port 105. Each of these stations has an open port extending into the hubs 102 and 104, respectively, and each station has a vacuum-sealed access port (not shown) to provide access to a station for cleaning, and for replacement or repair of parts. Each station includes a housing which defines a chamber.

In the detailed description, organic hole-transporting material is depicted as an illustrative example of an organic material for forming an organic hole-transporting layer 13 (see FIG. 1) in the station 130 (HTL) of FIG. 2. It will be appreciated that a thermal physical vapor deposition apparatus can be effectively used in accordance with aspects of the present invention to form an organic light-emitting layer 14 (see FIG. 1) in the station 140 (LEL) of FIG. 2, or to form an organic electron-transporting layer 15 (see FIG. 1) in the station 150 (ETL) of FIG. 2.

Figure 3:
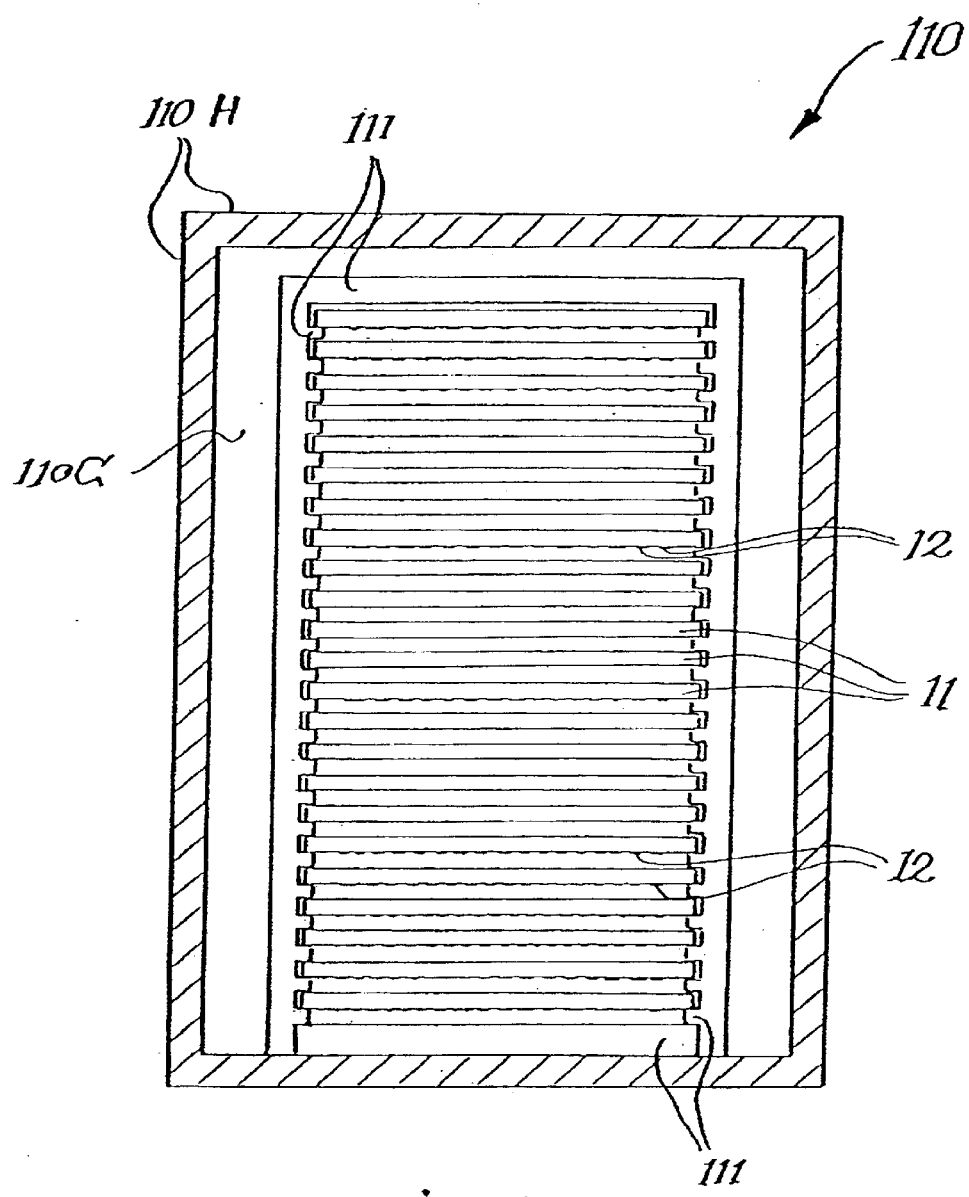
FIG. 3 is a schematic section view of a carrier containing a relatively large number of substrates or structures, and positioned in a load station of the apparatus of FIG. 2 as indicated by section lines 3—3 in FIG. 2.

FIG. 3 is a schematic section view of the load station 110, taken along section lines 3—3 of FIG. 2. The load station 110 has a housing 110H which defines a chamber 110C. Within the chamber is positioned a carrier 111 designed to carry a plurality of substrates 11 having preformed first electrodes 12 (see FIG. 1). An alternative carrier 111 can be provided for supporting a plurality of active matrix structures. Carriers 111 can also be provided in the unload station 103 and in the storage station 170.

Figure 4:
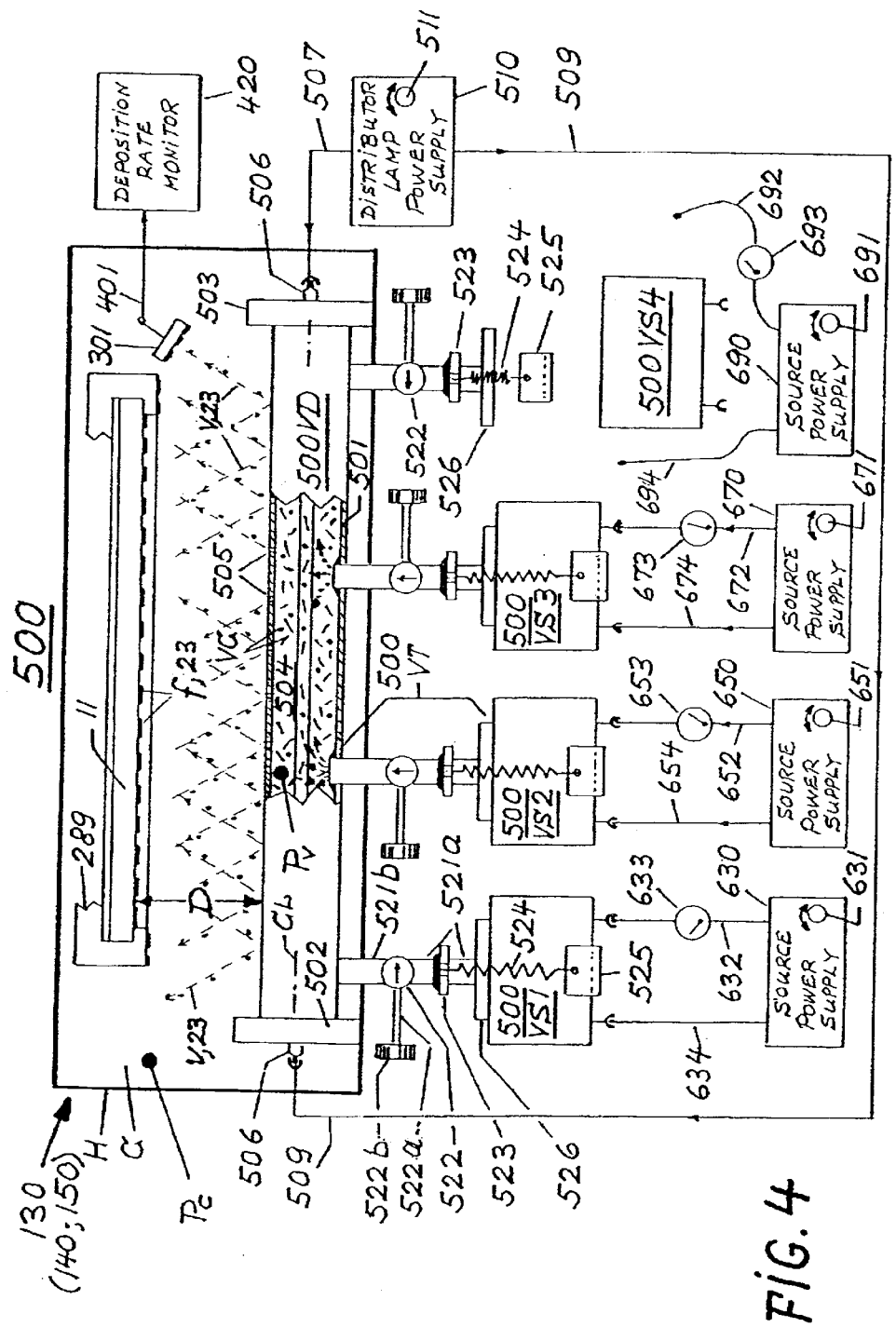
FIG. 4 is a schematic view of a thermal physical vapor deposition apparatus in accordance with the present invention in which a plurality of detachable organic material vapor sources are disposed outside of a chamber and are in vapor communication with an elongated vapor distributor disposed in a chamber held at a reduced pressure via corresponding vapor transport devices which include a valve to maintain the reduced pressure in the chamber when one or more vapor sources are detached.

Turning to FIG. 4, a schematic view is shown of a thermal physical vapor deposition apparatus 500 which includes aspects of the present invention.

A housing H defines a chamber C which is maintained at a reduced pressure $P_c$, typically less than $10^{-3}$ torr ($1.33 \times 10^{-1}$ pascal), and preferably less than $10^{-5}$ torr ($1.33 \times 10^{-3}$ pascal). Disposed in the chamber C are a substrate or structure 11 which is to receive an organic layer by vapor deposition, and an elongated vapor distributor 500VD spaced from the substrate or structure 11 by a distance D.

Disposed outside of the chamber C is a plurality of detachable vapor sources 500VS1–500VS4, with vapor sources 500VS1–500VS3 depicted in an attached position and vapor source 500VS4 shown in a detached position. The vapor sources contain vaporizable organic material and provide vaporized organic material when actuated by respective source power supplies 630, 650, 670, and 690.

Each of the attached vapor sources is sealingly connected to a dedicated vapor transport device 500VT which includes a valve 522. The valve 522 is shown schematically to be in a closed position by a horizontal arrow, and to be in an open position by a vertical arrow. Each vapor transport device 500VT extends sealingly into a cavity 504 of the elongated vapor distributor 500VD.

Vapor sources 500VS2 and 500VS3 are shown operative to provide vaporized organic materials which are communicated into the cavity 504 of the vapor distributor 500VD through the respective vapor transport devices 500VT having corresponding valves in an open position. Organic material vapors provided by the vapor source 500VS2 via the vapor transport device are depicted in dashed outline within the cavity, and organic material vapors provided by the vapor source 500VS3 are shown in dotted outline.

A plurality of vapor efflux apertures 505 are formed in the tubular wall 501 of the vapor distributor 500VD along a line which extends in the elongated direction of the distributor and which faces the substrate or structure 11. The vapor efflux apertures 505 are sized and spaced from one another (see FIG. 6) so that a vapor pressure $P_V$ of organic material vapors in the cavity 504 will result in forming a vapor cloud VC which is spread uniformly throughout the cavity of the elongated vapor distributor. The vapor sources 500VS2 and 500VS3 shown operative in FIG. 4 are actuated by the corresponding source power supplies 650, 670 to vaporize solid organic material at rates which provide the vapor pressure $P_V$ in the cavity 504, with $P_V$ being greater than the reduced pressure $P_C$ in the chamber C.

A portion of the vapors forming the vapor cloud VC issues from the cavity 504 through the vapor efflux apertures 505 into the space between the distributor 500VD and the structure 11 as vapor streams $v_v23$ (vapor streams from vapors provided by vapor source 500VS2 and by vapor source 500VS3) which define a deposition zone. These vapor streams $v_v23$ are indicated by dashed and dotted outlines and are directed towards the substrate or structure 11 to condense thereon as a layer $f_v23$ being formed, depicted in bold dashed outline. A crystal mass-sensor 301 receives a portion of the vapor streams $v_v23$ and provides a mass-proportional signal to a deposition rate monitor 420 via a sensor signal lead 401.

The elongated vapor distributor 500VD, also referred to as a tubular vapor distributor, has the cavity 504 which is defined by the tubular wall 501 and by end caps 502, 503 which are in sealing engagement (not shown) with the tubular wall 501. The vapor distributor 500VD is heated by a distributor heat lamp 506 disposed in the cavity 504 with respect to a center line CL of the distributor, so that a distributor temperature is maintained which precludes significant condensation of vapors within the cavity 504 or in the vapor efflux apertures 505.

Various configurations of vapor distributors 500VD can be used in the practice of the present invention. Such configurations have been disclosed as various embodiments of tubular sources in commonly assigned U.S. patent application Ser. No. 09/843,489, filed Apr. 26, 2001 to Steven A. Van Slyke et al., entitled "Physical Vapor Deposition of Organic Layers Using Tubular Sources for Making Organic Light-Emitting Devices", the disclosure of which is herein incorporated by reference.

The vapor transport devices 500VT include an upper portion 521b of a vapor transport conduit which sealingly extends into the cavity 504 of the vapor distributor 500VD, and which is connected to an upper connection of the valve 522. The valve 522 has a valve stem 522a and a valve handle 522b attached to the valve stem for setting the valve into an open position or into a closed position. Other types of valves can be used effectively, as is well known in the art vacuum systems design and technology. A lower portion 521a of a vapor transport conduit is connected to a lower connection of the valve 522.

The valve(s) 522 can be constructed to provide 3-position operation. For example, in a first position the valve is in an open position for connecting the vapor distributor 500VD through the vapor transport device 500VT to an attached vapor source 500VS. In a second position the valve 522 is in a closed position. In a third position the valve 522 remains in a closed position, and provides a "bleeder" opening (not shown) through which air or an inert gas can be introduced into the lower portion 521a of the vapor transport conduit and into the vapor source to bring the vapor source to atmospheric pressure prior to detaching the source. Alternatively, when the valves 522 provide only 2-position operation, i.e. either an open position or a closed position, a separate valve (not shown) can be provided at a "bleeder" port in the lower portion 521a of the vapor transport conduit or in the source cover 526 to introduce air or an inert gas when the valve 522 is in the closed position.

A source retainer flange 523 is attached to the lower portion 521a of the vapor transport conduit. The source retainer flange 523 has source retainer flange arms 523a, 523b (see FIG. 8 and FIG. 12) on which one end of source-retaining tension springs 524a, 524b (see FIG. 12) can be affixed. Only the source retainer flange 523 and a source-retaining tension spring 524 are identified in the drawing of FIG. 4. Another end of the source-retaining tension spring 524 (or of the tension springs 524a, 524b) is affixed to a source retainer 525 which extends across a lower outer surface of each of the attached vapor sources 500VS1–500VS3. The tension provided by the tension spring(s) pushes the attached vapor sources upwardly to provide a sealing engagement between an upper surface of each vapor source and a source cover 526, sealingly attached (see FIGS. 6, 7, and 9–11) to the lower portion 521a of the vapor transport conduit which extends through the source cover into the attached vapor source(s).

An attached vapor source is detached, upon discontinuing vaporization of organic material received in the source and upon setting the valve 522 to a closed position, by sliding the source retainer 525 off the lower outer surface of the vapor source to be detached. The source-retaining tension spring (s) will retract to a relaxed or substantially untensioned state while retaining the source retainer 525, as shown with reference to the detached vapor source 500VS4.

A source power supply 630 having a regulator 631 is connected to a vaporization heater (see FIGS. 6–8), dedicated to thermally vaporize solid organic material received in the vapor source 500VS1, via lead 632, a current meter 633, and a lead 634. The regulator can be adjusted to provide a heating current (or a heating power) to flow through the vaporization heater to heat the vaporizable organic material in the source to a temperature at which a portion of the organic material vaporizes, usually by sublimation, at a desired rate of vapor formation. Since the valve 522 of the vapor transport device associated with the vapor source 500VS1 is shown in a closed position, the regulator 631 is adjusted so that substantially no heating current is flowing through the vaporization heater as indicated by the current meter 633.

Similarly, a source power supply 650 having a regulator 651 is connected via lead 652, current meter 653, and a lead 654 to a vaporization heater associated with the vapor source 500VS2. The regulator 651 is adjusted to provide a heating current to flow through the vaporization heater so that vaporizable organic material received in the source 500VS2 vaporizes at a desired rate of vapor formation. The heating current is indicated by the current meter, and schematically by the arrow in the leads 652 and 654.

The vapor source 500VS3 is also operative, as indicated by the arrow in the leads 672 and 674, and by the current meter 673 which reads a heating current flowing through a vaporization heater associated with this vapor source, the heating current provided by a source power supply 670 via a regulator 671.

A source power supply 690 is associated with a vaporization heater dedicated to the detached vapor source 500VS4. A regulator 691, leads 692, 694, and a current meter 693 correspond to previously described like elements.

The distributor heat lamp 506 is powered (when operative) by a distributor lamp power supply 510 which is connected to terminals of the lamp 506 via respective leads 507 and 509. A regulator 511 is adjusted to achieve a desired temperature of the elongated vapor distributor 500VD as measured, for example, by a temperature-measuring device (not shown) associated with the vapor distributor.

From the above description of FIG. 4, is will be appreciated that any one or all attached vapor sources can be detached from corresponding vapor transport devices 500VT, and that detached vapor sources can be attached to corresponding vapor transport devices while maintaining the reduced pressure $P_C$ in the chamber C.

In FIG. 4, four detachable or attachable vapor sources are shown as an illustrative example. In this configuration of the inventive thermal physical vapor deposition apparatus 500, a first vapor source can be charged with a first vaporizable solid organic host material. A second vapor source can receive a second vaporizable solid organic host material. A third vapor source can contain a first vaporizable solid organic dopant material, and a fourth vapor source can receive a second vaporizable solid organic dopant material.

If the vapor deposition apparatus 500 of FIG. 4 is installed in the station 130 (HTL) of FIG. 2, the first vapor source can be charged with a first organic hole-transporting host material, and the second vapor source can receive a second organic hole-transporting host material. The third vapor source can contain a first color-neutral organic dopant material, and the fourth vapor source can receive a second color-neutral organic dopant material. With these four vapor sources attached and operative, a molecular mixture or dispersion of four organic material vapors can be formed in the cavity 504 of the elongated vapor distributor 500VD, and vapor streams 13v, 1234 would issue from the vapor efflux apertures 505 and be directed towards the substrate or structure 11 to form a composite, doped organic hole-transporting layer 13, 1234 on the structure.

Alternatively, one or two of the vapor sources can be charged with vaporizable solid organic hole-injecting materials, and a third vapor source can receive, for example, a mixture of two organic hole-transporting host materials. A fourth vapor source can be charged with one color-neutral organic dopant material or with a mixture of color-neutral organic dopant materials. In this configuration, an organic hole-injecting layer is formed on the substrate or structure 11 as a first layer by operating only the one or two vapor sources charged with hole-injecting material(s). Upon formation of the hole-injecting layer, vaporization of hole-injecting materials is discontinued, and vaporization of organic materials contained in the third and fourth vapor sources is started to provide a doped (or undoped) organic hole-transporting layer 13 over the hole-injecting layer.

If the thermal physical vapor deposition apparatus 500 of FIG. 4 is installed in the station 140 (LEL) of FIG. 2, one vapor source can be charged with an organic light-emitting host material, and a second vapor source can receive, for example, a color-neutral organic dopant material. A third and a fourth vapor source can contain, respectively, a first and a second color-modifying organic dopant material selected to modify the color or hue of light emission in a completed and operative OLED compared to the hue of emitted light attributed to the organic light-emitting host material.

If the vapor deposition apparatus 500 of FIG. 4 is installed in the station 150 (ETL) of FIG. 2, one vapor source can be charged with a first organic electron-transporting host material, and a second vapor source can receive a second electron-transporting organic host material. A third and fourth vapor source can contain, respectively, a first and a second color-neutral organic dopant material.

The use of dopants to provide a doped layer on a structure has been described, for example, in the above-referenced U.S. Pat. No. 4,769,292 in which one or more dopants are incorporated in an organic light-emitting layer to provide a shift of color or hue of emitted light. Such selected shifting or change of color is particularly desirable when constructing a multi-color or full-color organic light-emitting device.

So-called color-neutral dopants can be effectively used in conjunction with an organic hole-transporting layer in conjunction with an organic electron-transporting layer, or in conjunction with both of such layers, to provide an organic light-emitting device having enhanced operational stability or extended operational life time, or enhanced electroluminescent efficiency. Such color-neutral dopants and their use in an organic light-emitting device are disclosed by Tukaram K. Hatwar and Ralph H. Young in commonly assigned U.S. patent application Ser. No. 09/875,646, filed Jun. 6, 2001, the disclosure of which is herein incorporated by reference.

The use of a uniformly mixed organic host layer having at least two host components is disclosed by Ralph H. Young, et al. in commonly assigned U.S. patent application Ser. No. 09/753,091, filed Jan. 2, 2001, the disclosure of which is herein incorporated by reference.

The solid organic materials received in the detachable (and attachable) vapor sources can be in the form of powders, flakes, or particulates, or in the form of agglomerated pellets.

Figure 5:
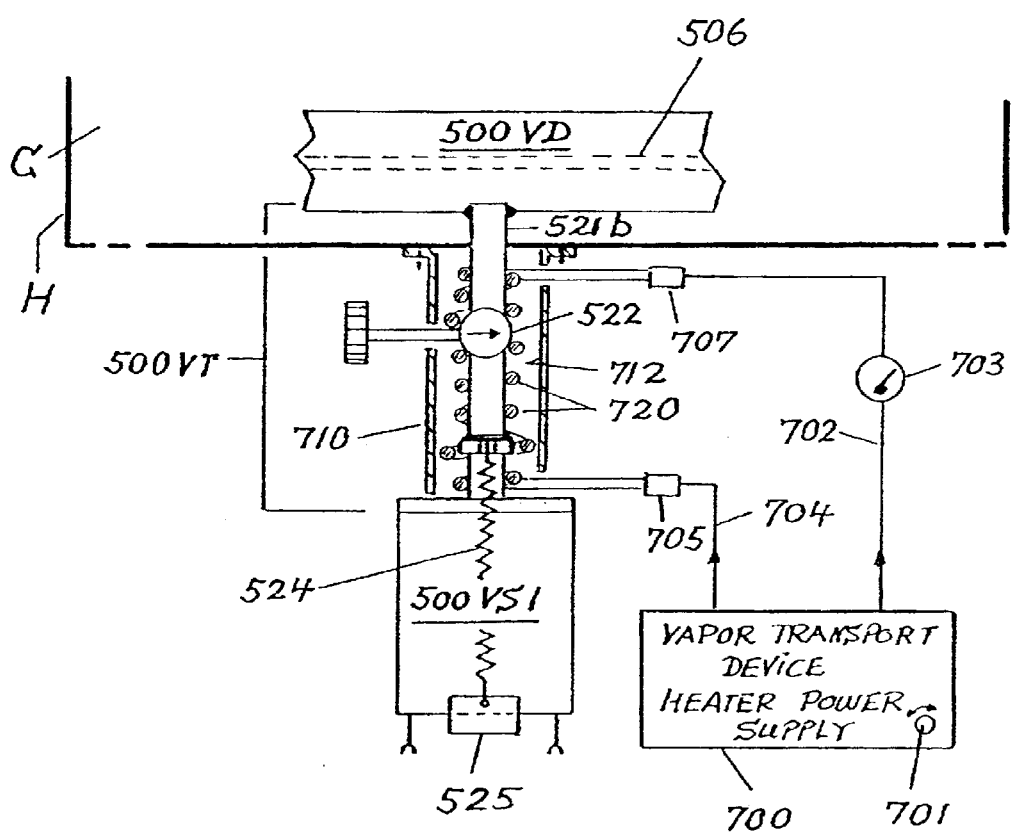
FIG. 5 is a schematic view of a thermal physical vapor deposition apparatus in accordance with one aspect of the present invention and showing a heating coil for heating a vapor transport device.

Turning to FIG. 5, a schematic view of the thermal physical vapor deposition apparatus is shown in which the vapor transport device 500VT is heatable by a heating coil 720 to a temperature sufficient to prevent condensation of organic vapor(s) provided by the vapor source 500VS1 along interior surfaces of the vapor transport device. The heating coil 720 is surrounded by a heat shield 710 which has heat-reflective interior surfaces 712. The heating coil 720 is heated by current flow provided by a vapor transport device heater power supply 700 which includes a regulator 701. Lead 702 connects the power supply 700 with one termination of the heating coil 720 via a current meter 703 at a connector 707, and lead 704 connects the power supply 700 with another termination of the heating coil 720 at a connector 705. The detachable vapor source 500VS1 with source-retaining tension spring 524 and source retainer 525, elements of the vapor transport device 500VT, and the vapor distributor 500VD are the same elements described with reference to FIG. 4.

Figure 6:
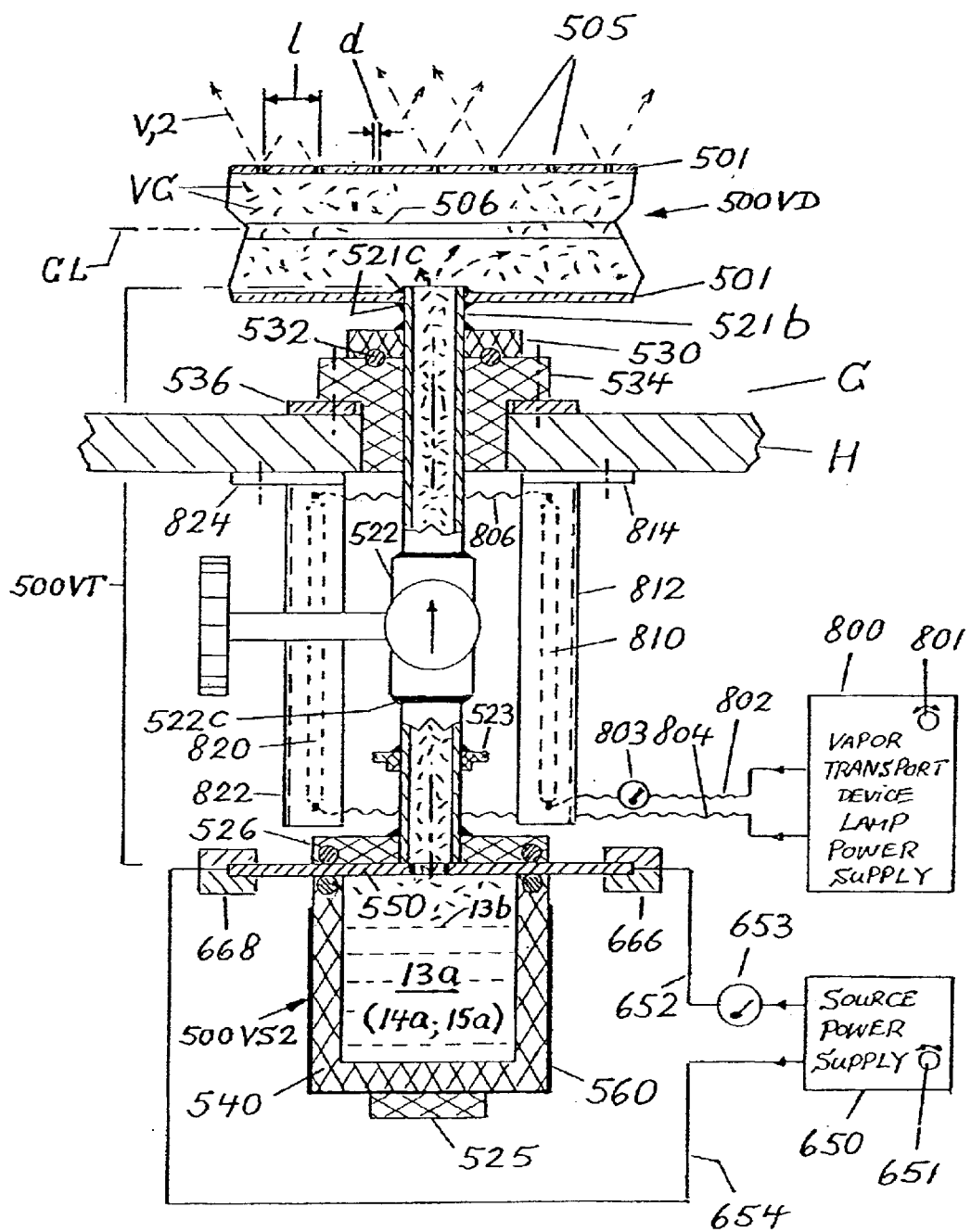
FIG. 6 is a schematic view of a thermal physical vapor deposition apparatus in accordance with the present invention and showing one embodiment of a planar source vaporization heater, heat lamps for heating a vapor transport device, and a heat lamp for heating an elongated vapor distributor.

Turning to FIG. 6, a sectional view of portions of the thermal physical vapor deposition apparatus is shown in which a planar vaporization heater 550 is disposed between the vapor source 500VS2 of FIG. 4 and a source cover 526. Additionally, heat lamps 810 and 820 and corresponding heat reflectors 812 and 822 are shown as an alternative means for heating the vapor transport device 500VT.

The elongated vapor distributor 500VD is disposed in the chamber C which is held at a reduced pressure as described with reference to FIG. 4. The vapor efflux apertures 505 have a diameter d which can be in a range from 0.1–0.5 mm, and these apertures have a spacing 1 which can be in a range from 2–20 mm. Within these ranges, a particular diameter d and a particular aperture spacing 1 are selected so that the vapor cloud VC of organic vapors provided by vapor source 500VS2 (depicted in dashed outline) will spread uniformly throughout the cavity 504 (not identified in FIG. 6) of the distributor 500D. Vapor streams V,2 are issuing from the apertures 505 in the manner described previously.

The upper portion 521b of the vapor transport conduit extending into the cavity of the vapor distributor is sealed with respect to the tubular wall 501 by vapor distributor seals 521c, which can be temperature-tolerant seals of an epoxy material or of other well known sealing materials used in the field of vacuum systems technology. The upper portion 521b extends through a thermally insulative plate 530 having an upper surface (not identified) which is sealed against the upper portion. A lower surface (not identified) of the plate 530 is sealed by a gasket 532 against an upper surface (not identified) of a thermally insulative bushing 534 which extends into or through the housing H. A lower surface (not identified) of the bushing is sealed by a bushing gasket 536 against an upper surface (not identified) of the housing H, i.e. against the surface of the housing H which faces the chamber C. The valve 522 is sealed by valve seals 522c (only one valve seal is identified in the drawing) against both the upper portion 521b and the lower portion 521a (see FIG. 4 and FIG. 7) of the vapor transport conduit.

In the drawing of FIG. 6, parts shown in cross-hatched sectional outline are preferably made of thermally insulative materials such as, for example, quartz, or a ceramic material. The upper and lower portions of the vapor transport conduit can be constructed of a metal, or of a thermally insulative material such as, for example, quartz, ceramic material, or boron nitride material. The body of the valve 522 can be a metal body or a ceramic body. The tubular wall 501 of the vapor distributor 500VD can be constructed of a metal, a ceramic material, or of boron nitride. The end caps 502, 503 (see FIG. 4) of the vapor distributor are preferably constructed of a thermally and electrically insulative material such as, for example, quartz or a ceramic material.

Figure 7:
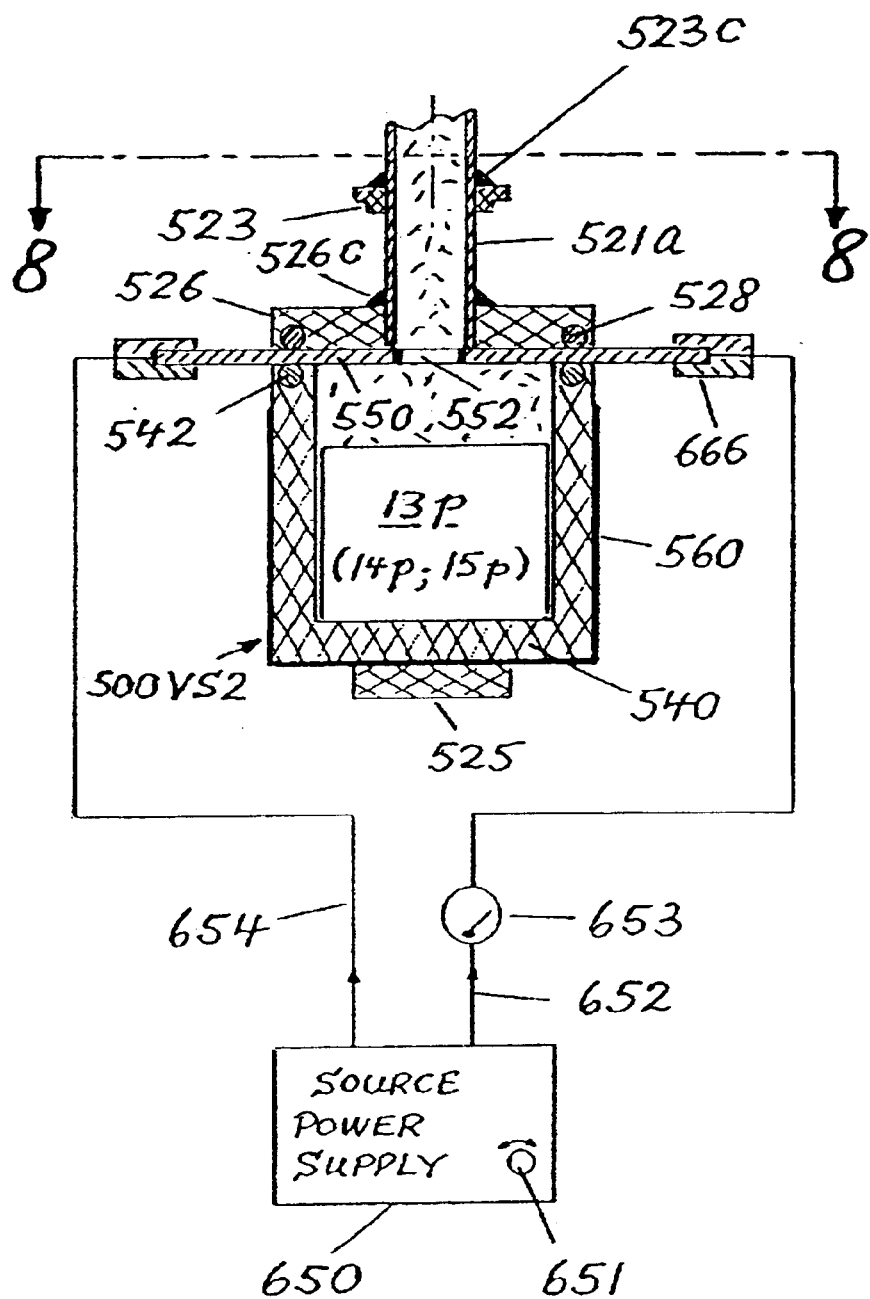
FIG. 7 is a sectional view of the vapor source depicted in FIG. 6 and showing seals and gaskets, and defining an aperture in the planar vaporization heater.

The source retainer flange 523, also preferably constructed of a thermally insulative material, is fastened on the lower portion 521 a of the vapor transport conduit by a seal or by seals 523c (see FIG. 7). The lower portion 521a extends through the thermally and electrically insulative source cover 526 which is sealed against the conduit by a source cover seal 526c (see FIG. 7). The source cover 526 includes a temperature-tolerant source cover gasket 528 (see FIG. 7) which sealingly engages an upper surface (not identified) of the planar vaporization heater 550.

The planar vaporization heater is preferably constructed of tantalum sheet material, and is shaped to be sealingly contained or positioned between the source cover gasket 528 and a temperature-tolerant container gasket 542 (see FIG. 7) disposed at or proximate a common upper surface of a container 540. The container 540 is preferably constructed of a thermally and electrically insulative material such as, for example, quartz or a ceramic material. The planar vaporization heater 550 includes a vaporization heater opening 552 (see FIG. 7) through which vaporized organic material can transfer from the container into the vapor transport device 500VT and hence into the vapor distributor 500VD.

The vaporization heater also includes electrical connecting flanges 556 and 558 (see FIG. 8) for connecting the source power supply 650 via its leads 652 and 654 by respective connecting clamps 666 and 668.

The container 540 includes at least one heat-reflective coating 560 extending across a bottom surface and along side wall surfaces of the container. The heat-reflective coating 560 is shown applied to exterior surfaces of the container. Such coating can be provided along interior surfaces instead of, or in addition to, the exterior-surface coating. The heat-reflective coating or coatings can be formed of a multilayer dielectric stack designed to reflect heat radiation back into the container. Alternatively the heat-reflective coating can be formed of a metal or metals having mirror-like reflective properties.

The container 540 can have a polygonal outline or a cylindrical outline. A solid organic hole-transporting material 13a (or an organic light-emitting material 14a, or an organic electron-transporting material 15a) in the form of a powder, flakes, or particulates, is received in the container to a fill-level 13b. Such solid organic materials were filled into the container in the detached position of the vapor source 500VS2.

A vapor transport device heat lamp power supply 800 includes a regulator 801 for regulating an electrical current flow through the heat lamps 810, 820, which are shown connected in series via lamp connecting lead 806, shown in wavy outline. A lamp lead 802 connects the lamp power supply 800 via current meter 803 to a heat lamp terminal of heat lamp 810, and a lamp lead 804 connects the lamp power supply to a heat lamp terminal of heat lamp 820. Heat reflector 812 is shown mounted by a reflector mounting bracket 814 to the housing H, and heat reflector 822 is affixed to the housing H by a reflector mounting bracket 824. The heat lamps 810, 820 are held in position within the corresponding heat reflectors 812, 822 by heat lamp retainers (not shown).

Turning to FIG. 7, the sectional view of the vapor source 500VS2 shows the container 540 charged with a solid agglomerated pellet 13p of an organic hole-transporting host material (or with a pellet 14p or a pellet 15p of an organic light-emitting host material or an organic electron-transporting host material, respectively).

The preparation of such solid organic pellets, also referred to as agglomerated organic pellets, has been disclosed by Steven A. Van Slyke, et al. in commonly assigned U.S. patent application Ser. No. 09/898,369, filed Jul. 3, 2001, entitled "Method of Handling Organic Material in Making an Organic Light-Emitting Device", the disclosure of which is herein incorporated by reference.

A retainer flange seal 523c and a source cover seal 526c are shown. Also depicted are the source cover gasket 528 and the container gasket 542. These temperature-tolerant gaskets are made of a temperature-tolerant material which can include silicone-based materials. The vaporization heater opening 552 is identified.

Figure 8:
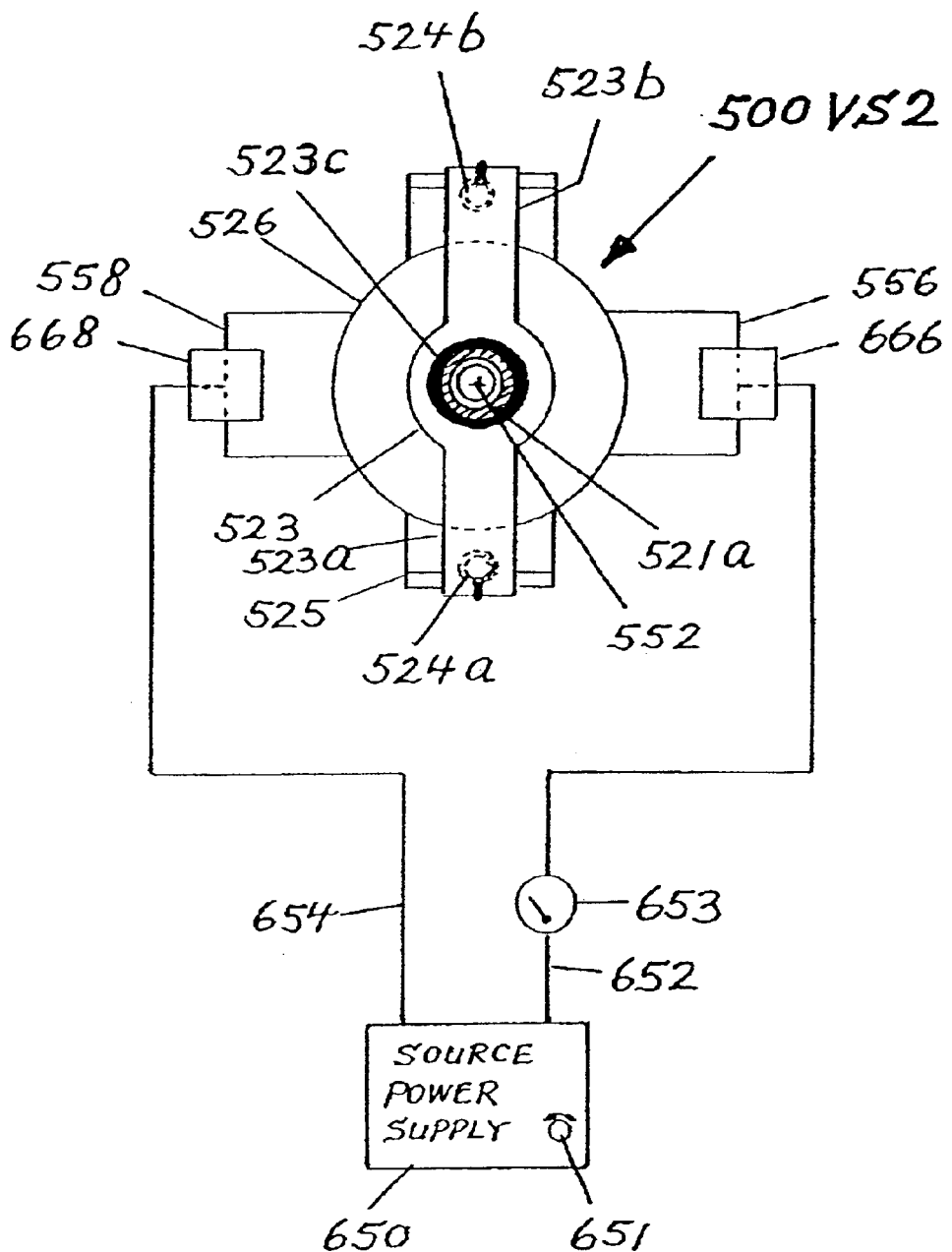
FIG. 8 is a schematic top view of the vapor source, taken along the lines 8—8 of FIG. 7, and showing flange arms extending from a flange for connecting source-retaining tension springs between the arms and a source retainer.

Turning to FIG. 8, a schematic top view of the vapor source 500VS2 is shown, taken along the lines 8—8 of FIG. 7. Source retainer flange arms 523a and 523b extend from the source retainer flange 523 which is affixed to the lower portion of the vapor transport conduit 521a by the retainer flange seal 523c. A source-retaining tension spring 524a is attached to the flange arm 523a and to one end of the source retainer 525. Another source-retaining tension spring 524b is attached to the flange arm 523b and to another end of the source retainer 525. The electrical connecting flanges 556 and 558 of the planar vaporization heater 550 (see FIGS. 6, 7) are indicated.

Figure 9:
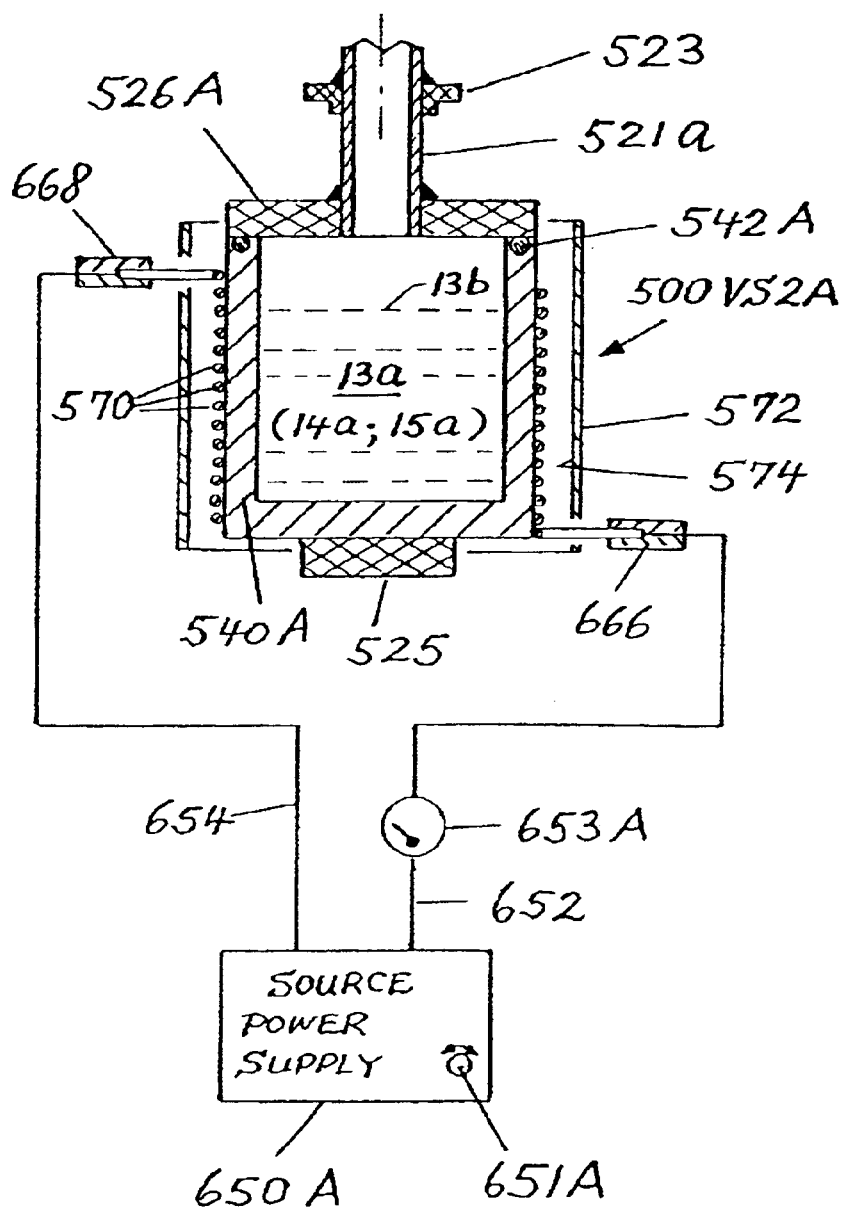
FIG. 9 is a sectional view of a modified vapor source in accordance with an aspect of the present invention in which organic material in a thermally conductive container can be vaporized by a vaporization heating coil.

Turning to FIG. 9, a sectional view of a modified vapor source 500VS2A depicts a vaporization heating coil 570 surrounding outer side wall surfaces (not identified) of a container 540A. A heat shield 572 having a heat-reflective surface 574 is spaced from the coil 570. A source power supply 650A with a regulator 651A provides electrical current (or electrical power) flow through the coil 570 via lead 652, current meter 653A, and lead 654.

The container 540A is preferably an electrically insulative and thermally conductive container to provide heat transfer by conduction through the container walls to cause portions of the solid organic material(s) 13a (or 14a, or 15a) in the container to vaporize. A material suitable for making such container is boron nitride which has moderate thermal conductivity and relative high electrical resistivity.

The source cover 526A differs from the previously described source cover 526 in that the source cover gasket 528 (see FIG. 7) is not required. A container gasket 542A sealingly engages an upper surface of the container 542A with a lower surface of the source cover 526A when the vapor source is attached to the vapor transport device.

Figure 10:
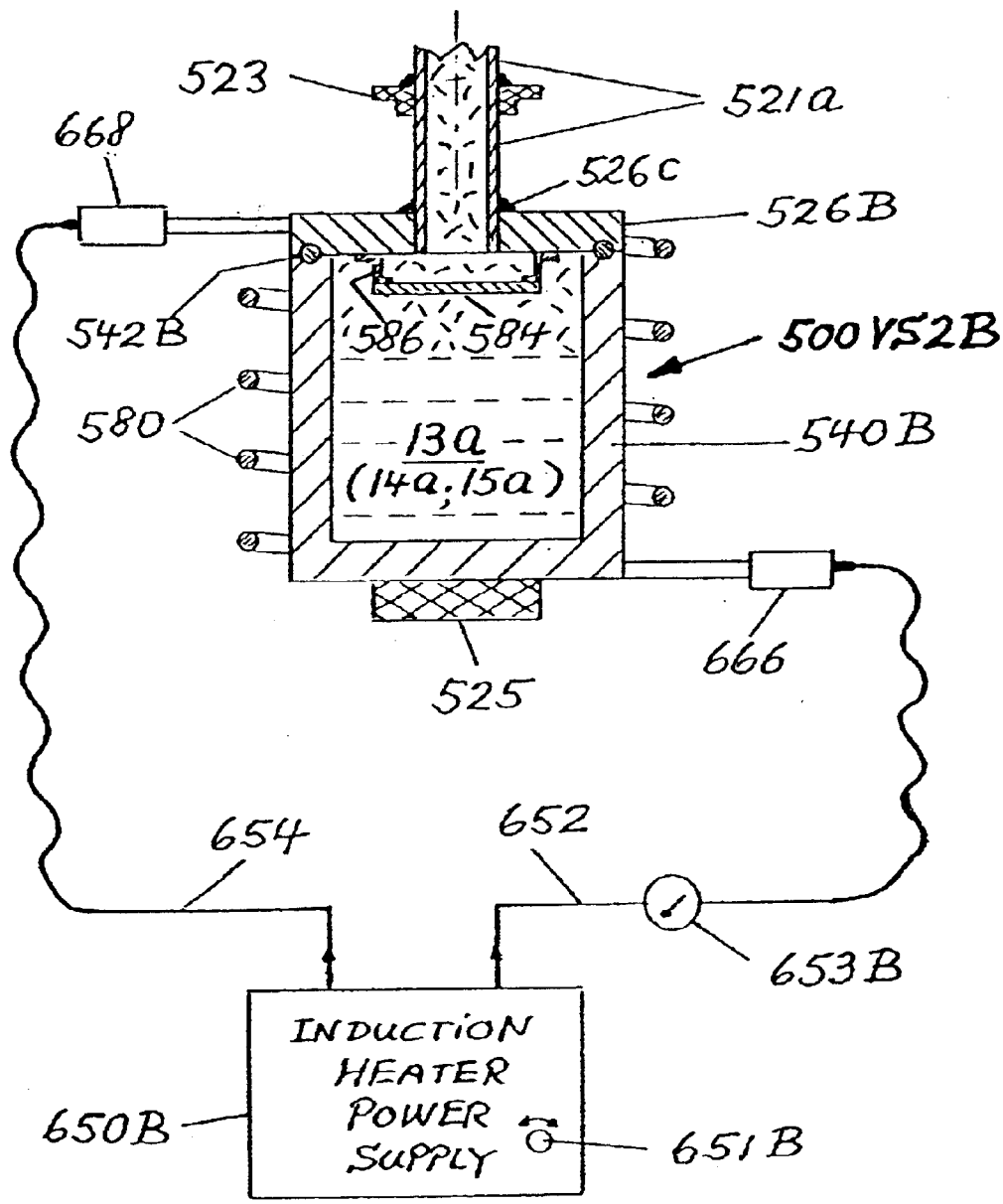
FIG. 10 is a sectional view of a modified vapor source in accordance with another aspect of the present invention in which organic material in an electrically conductive container is vaporized by an induction heating coil, and showing a baffle member.

Turning to FIG. 10, a sectional view of a modified vapor source 500VS2B is shown in which an organic hole-transporting material 13a (or an organic light-emitting material 14a, or an organic electron-transporting material 15a) is received in an electrically conductive container 540B which is in sealing engagement with an electrically conductive cover 526B via a container gasket 542B. The solid organic material, or at least a portion thereof, is vaporized by a vaporization induction-heating coil 580 which surrounds the container in a spaced relationship. The induction-heating coil is actuated by an induction heater power supply 650B which can be regulated by a regulator 651B to provide current flow through the induction-heating coil, as indicated by a current meter 653B. The power supply 650B can provide an electrical potential, and a drive current, at a frequency which provides optimal inductive heating of the container 540B and the cover 526B.

A baffle member 584 is shown attached to an under side of the cover 526B by baffle supports 586. The baffle member 584 can be used with any of the vapor sources described above to effectively block particulates, i.e. particles of organic material from being projected into the lower portion 521a of the vapor transport conduit, while permitting vapor (s) of organic material(s) to project from the container around the baffle member into the vapor transport conduit.

Figure 11A:
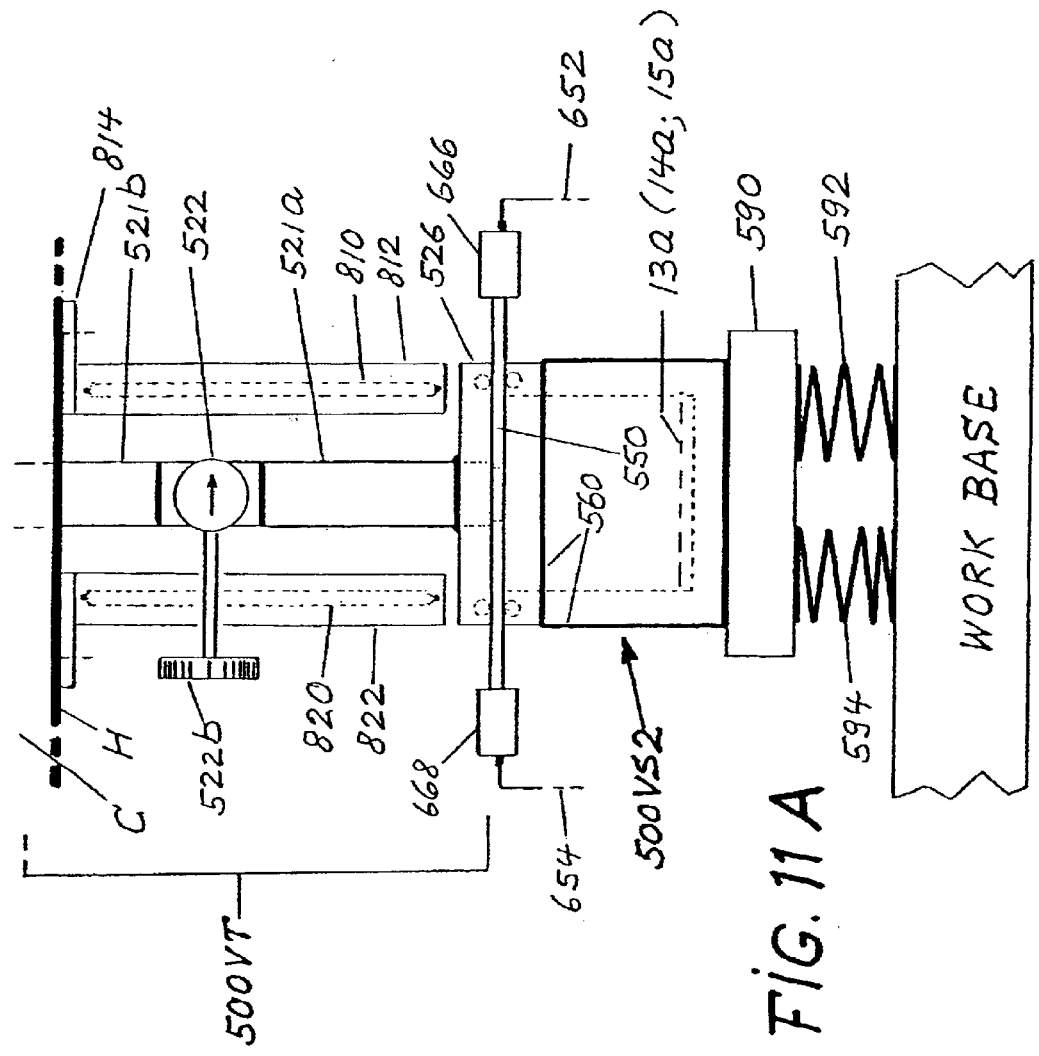

Turning to FIGS. 11A–11C, another embodiment of a detachable vapor source is depicted schematically. The vapor source 500VS2, planar vaporization heater 550, and the heat lamps 810, 820 and heat reflectors 812, 822 for heating the vapor transport device 500VT are shown as illustrative examples. The valve 522 is in a closed position as indicated by the horizontal arrow.

In FIG. 11A, the vapor source 500VS2 is shown positioned over a thermally insulative support plate 590 which is pressed upwardly by source-retaining compression springs 592 and 594 with respect to a work base. In the compressed condition the compression springs provide a sealing engagement between the vapor source 500VS2 and the planar vaporization heater 550, and between the heater and the source cover 526 via respectively corresponding gaskets 542 and 528. Only the outline of the heat-reflective coating 560 is shown.

In FIG. 11B, the vapor source has been detached from the source cover 526, and the compression springs 592, 594 are now in a relaxed or uncompressed state.

FIG. 11C shows the detached vapor source 500VS2 positioned on the work base, in preparation for cleaning and/or recharging with organic material(s) 13a (or 14a, or 15a). The planar vaporization heater 550 with its connecting clamps 666, 668 is depicted leaning against an upper edge of the vapor source.

Figure 12A:
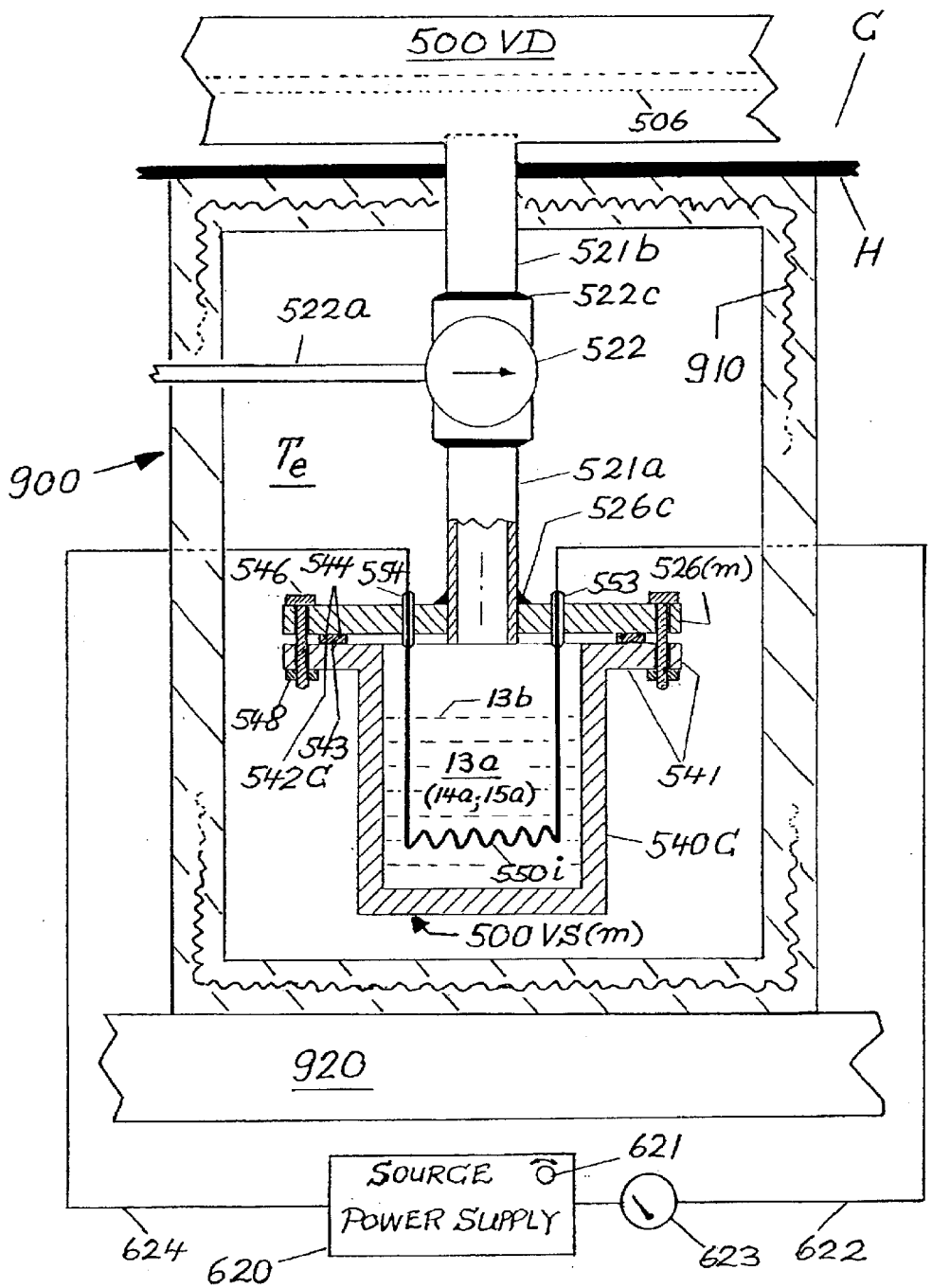

Turning to FIGS. 12A–12C, another embodiment of a detachable vapor source is depicted schematically. The modified vapor source 500VS(m) includes a metal container 540C and a modified metal source cover 526(m) which supports an immersion vaporization heater 550i via feedthroughs 553, 554 fixedly disposed in the cover. The immersion vaporization heater 550i can be heated to cause vaporization of a portion of vaporizable solid organic material(s) 13a, or 14a, or 15a received in the container. Such heating is effected by electrical current flow through the heater and provided by a source power supply 620 via regulator 621, a current meter 623, and leads 622, 624.

The metal container 540C and the source cover 526(m) are preferably constructed of stainless steel to provide structural integrity during compression of a metal gasket 542C disposed between the cover 526(m) and a container flange 541. The gasket 542C is preferably made of a compressible material, for example of copper, brass, or aluminum. Sealing engagement between the container flange 541 and the source cover 526(m) is provided by compression ridges 543 formed in the container flange 541 and by compression ridges 544 formed in the cover 526(m) upon sufficient tightening of a plurality of bolts 546 which extend through the cover 526(m) into or through the flange 541. Nuts 548 are shown in FIG. 12A to mate with the bolts 546 to provide for compression of the metal gasket 542C. Alternatively, a plurality of threaded bores (not shown) can be formed in the container flange 541 or in the cover 526(m) to engage the bolts 546.

The valve 522 (shown in a closed position), lower and upper portions of vapor transport conduits 521a and 521b, respectively, and the vapor distributor 500VD correspond to like elements described above.

In order to prevent condensation of vapors of vaporized organic material on relatively cool surfaces of the container 540C, the cover 526(m), and elements 521a, 522, and 521b of the vapor transport device 500VT, the vapor source 500VS(m) and the vapor transport device are disposed within a heatable enclosure 900 which is positioned on an enclosure support 920. The enclosure 900 can be, for example, a conventional laboratory oven which includes heating elements 910 to provide a temperature $T_e$ within the enclosure which is insufficient to vaporize organic material received in the container 540C but which is sufficient to prevent condensation of vaporized organic material on surfaces of the vapor source and the vapor transport device.

Such heatable enclosure 900 can be used advantageously instead of, or in addition to, the previously described means for preventing condensation of organic material vapors on inner surfaces of vapor sources and vapor transport devices.

In FIG. 12B, the container 540C has been removed from the heatable enclosure 900 through an access door (not shown). Compression ridges 544 in the source cover 526(m) are shown more clearly, and three bolts 546 are indicated extending through the cover.

FIG. 12C shows the container 540C positioned on a work base in preparation for cleaning or for recharging with vaporizable organic material. A compression ridge 543 formed in the container flange 541 is depicted, and the metal gasket 542C is shown positioned over the flange 541. Typically, a new, i.e. previously uncompressed gasket 542C, is provided prior to sealingly mating the container 540C with the source cover 526(m).

Figure 13:
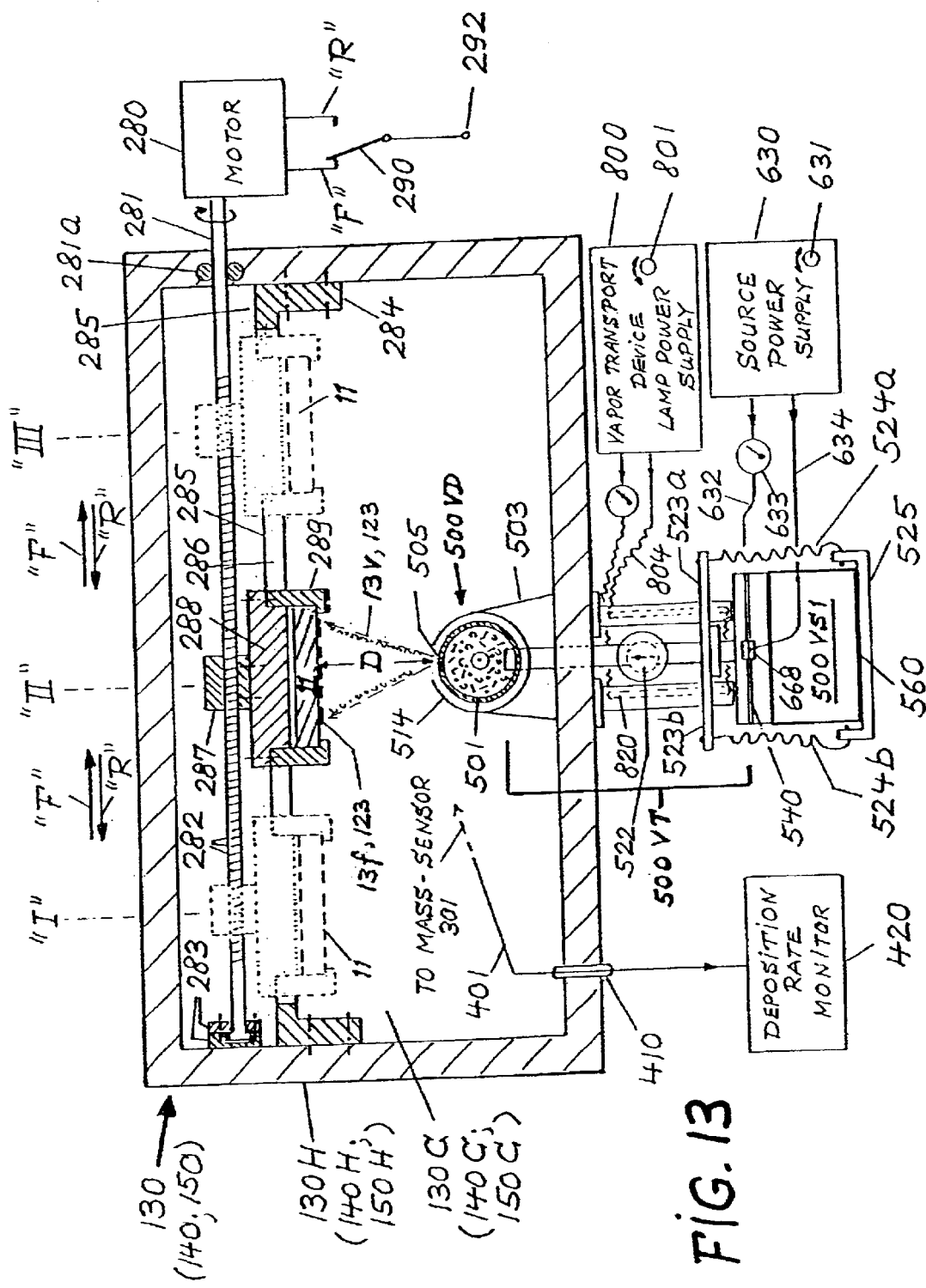
FIG. 13 is a schematic sectional view of a vapor deposition station dedicated to forming vapor-deposited organic hole-transporting layers (HTL) on structures in the OLED apparatus of FIG. 2 as indicated by section lines 12—12 in FIG. 2, and showing a structure being moved by a lead screw with respect to a fixedly disposed vapor distributor to provide a uniformly vapor-deposited organic hole-transporting layer over the structure in the thermal physical vapor deposition apparatus, in accordance with an aspect of the present invention.

Turning to FIG. 13, a schematic sectional view of the vapor deposition station 130 of the OLED apparatus of FIG. 2 is shown, as indicated by the section lines 13—13 in FIG. 2. Elements and functions described with reference to the HTL station 130 are substantially identical in stations 140 (LEL) and 150 (ETL) of FIG. 2, as indicated in FIG. 13 by (140; 150), (140H; 150H), and (140C; 150C).

The station 130 has a housing 130H which defines a chamber 130C. The chamber is at a reduced pressure, typically at a pressure lower than $10^{-3}$ torr ($1.33 \times 10^{-1}$ pascal) and preferably at a pressure lower than $10^{-5}$ torr ($1.33 \times 10^{-3}$ pascal).

The vapor distributor 500VD is shown here with a heat shield 514 surrounding the tubular wall 501 and terminating so that vapor streams 13v, 123 can exit from the cavity 504 (see FIG. 4) through the vapor efflux apertures 505, unimpeded by the heat shield 514.

The vapor streams 13v, 123 are composite vapor streams which include vaporized organic materials produced in the vapor source 500VS1 shown in FIG. 13 (in curled outline of vapors) and in vapor sources 500VS2 (dashed outline of vapors) and 500VS3 (dotted outline of vapors). These three vapor sources (see FIG. 4) provide, via respective vapor transport devices 500VT, a molecularly dispersed or composite vapor to the vapor distributor 500VD which can include a vaporized first organic hole-transporting host material, a vaporized second organic hole-transporting host material, and a vaporized organic color-neutral dopant material.

The vapor source 500VS1 is attached by the tension springs 524a, 524b which extend between the source retainer 525 and respective source retainer flange arms 523a and 523b. The vapor source is operative via source power supply 630 as described above, and the vapor transport device 500VT is heated by heat lamps via the vapor transport device lamp power supply 800 described previously.

A doped (or undoped) organic hole-transporting layer 13 having improved uniformity is formed on the substrate or structure 11 by moving or translating the structure with respect to the vapor distributor 500VD first in a forward motion "F" from a starting position "I" through an intermediate vapor deposition position "II" to an end position "III" which is also a beginning position for a return or reverse motion "R" via the position "II" to the starting position "I".

In the intermediate vapor deposition position "II", the substrate or structure 11, the holder and/or mask frame 289, a glide shoe 288, and a lead screw follower 287 are shown in solid-outline sectional view. These elements are depicted in dotted and dashed outlines in a starting position "I" of the holder 289, and in an end position "III" of a forward motion "F" of the holder, which is also the beginning position of a reverse motion "R" (or return motion "R") of the holder 289 (and of the substrate or structure 11 held in the holder).

Forward motion "F" and reverse or return motion "R" are effected by a lead screw 282 which engages the lead screw follower 287. The follower 287 is attached to the glide shoe 288 which, in turn, supports the holder and/or mask frame 289. The glide shoe 288 glides along a glide rail 285, and is guided in a glide rail groove 286 formed in the glide rail 285. The glide rail 285 is supported by glide rail brackets 284 which may be fastened to the housing 130H, as shown in FIG. 13.

The lead screw 282 is supported at one end by a lead screw shaft termination bracket 283, and a lead screw shaft 281 is supported in the housing 130H by a shaft seal 281a. The lead screw shaft 281 extends through the housing 130H to a motor 280.

The motor 280 provides for forward motion "F" or reverse motion "R" via switch 290 which provides a control signal to the motor from an input terminal 292. The switch can have an intermediate or "neutral" position (not shown) in which the holder 289 can remain in either the end position "III" of forward motion, or in the starting position "I" in which a substrate or structure 11 with a completed organic layer is removed from the holder and/or mask frame 289 and a new substrate or structure is positioned in the holder.

Figure 14:
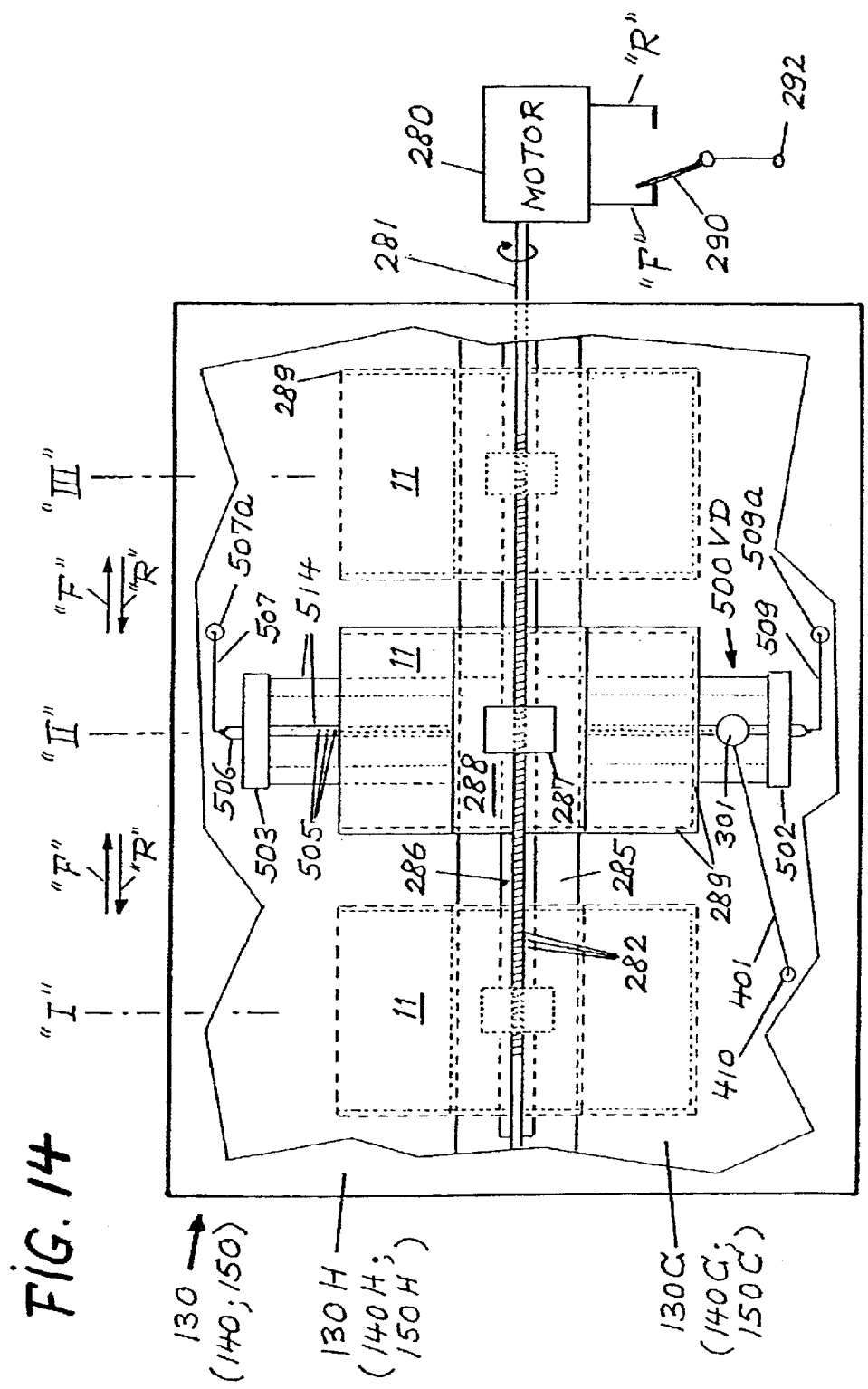
FIG. 14 is a schematic top view of a portion of the HTL vapor deposition station of FIG. 2 and showing a crystal mass-sensor disposed near an end portion of a plurality of vapor efflux apertures formed in the elongated vapor distributor.

Located near an end portion within the deposition zone of vapors 13v, 123 and outside the dimensions defined by the substrate or structure 11, is a crystal mass-sensor 301, as shown in FIG. 14. The crystal mass-sensor 301 intercepts a fraction of the vapor of organic material issuing from the vapor efflux apertures 505 at end portions of the plurality of apertures. The vapor condenses on the sensor to form a layer, thereby depositing mass on the sensor in the same manner as the vapor condenses on the substrate or structure 11 to form a layer on the substrate.

Sensor 301 is connected via a sensor signal lead 401 and a sensor signal feedthrough 410 to the deposition rate monitor 420.

As indicated schematically in FIG. 13 by bolded dashed lines, an organic hole-transporting layer 13f, 123 is being formed on the substrate or structure 11 during the forward motion "F" of the structure from the starting position "I" through the intermediate vapor deposition position "II" towards the end position "III" of forward motion. A completed organic hole-transporting layer 13 (see FIG. 1) is provided during a second pass of the substrate or structure through the deposition zone defined by vapors 13v, 123 in the reverse motion "R" from the end position "III", through the intermediate vapor deposition position "II", for termination at the starting position "I".

Upon termination at position "I" the completed structure is removed from the chamber 130C via robotic means (not shown) disposed in the buffer hub 102 (see FIG. 2), and the structure is advanced to another station, for example station 140, of the OELD apparatus 100 of FIG. 2. A new substrate or structure is advanced into the holder and/or mask frame 289 for vapor deposition of an organic hole-transporting layer 13 in the manner described above.

Turning to FIG. 14, a schematic top view of a portion of the HTL vapor deposition station 130 of FIG. 2 is shown which shows more clearly the placement of the crystal mass-sensor 301 at or near an end portion of the plurality of vapor efflux apertures 505, and at a position outside an area delineated by the substrate or structure 11. Also indicated are the heat shield 514, the end caps 502, 503 of the elongated vapor distributor 500VD, the line of vapor efflux apertures 505, the distributor heat lamp 506, and leads 507 and 509 connected to respective feedthroughs 507a and 509a which, in turn, provide for electrical connections outside the chamber to the distributor lamp power supply 510 (see FIG. 4).

In order to provide clarity of the drawings of FIGS. 4, 13, and 14, only the single crystal mass-sensor 301 is shown. Various other sensor configurations and methods for sensing and controlling vapor deposition of organic layers of an OLED can be used effectively in the practice of the present invention. For example, Michael A. Marcus et al. disclose a reusable mass-sensor in commonly assigned U.S. patent application Ser. No. 09/839,886, filed Apr. 20, 2001, the disclosure of which is herein incorporated by reference. Reusable optical sensing assemblies can also be used effectively in the practice of the present invention to make an OLED. Various optical sensing approaches have been used in controlling the thickness of an organic layer in making an OLED, as disclosed by Steven A. Van Slyke et al. in commonly assigned U.S. patent application Ser. No. 09/839,885, filed Apr. 20, 2001, the disclosure of which is herein incorporated by reference.

The invention has been described in detail with particular reference to certain preferred embodiments thereof, but it will be understood that variations and modifications can be effected within the spirit and scope of the invention.

PARTS LIST 10 organic light-emitting device (OLED)
11 substrate or structure
12 first electrodes
13 organic hole-transporting layer (HTL)
13a organic hole-transporting material powder
13b fill-level of organic hole-transporting material powder
13f, 123 organic hole-transporting layer being formed (from vapors of three organic materials)
13p solid pellet(s) of organic hole-transporting material
13v, 123 deposition zone of vapors of organic hole-transporting materials
13, 1234 organic hole-transporting layer
13v, 1234 vapor streams of organic hole-transporting materials
14 organic light-emitting layer (LEL)
14a organic light-emitting material powder
14p solid pellet(s) of organic light-emitting material
15 organic electron-transporting layer (ETL)
15a organic electron-transporting material powder
15p solid pellet(s) of organic electron-transporting material
16 second electrodes
18 encapsulation or cover
100 OLED apparatus 102 buffer hub
103 unload station
104 transfer hub
105 connector port
106 vacuum pump
107 pumping port
108 pressure gauge
110 load station
110C chamber
110H housing
111 carrier (for substrates or structures)
130 vapor deposition station (organic HTL)
130C chamber
130H housing
140 vapor deposition station (organic LEL)
140C chamber
140H housing
150 vapor deposition station (organic ETL)
150C chamber
150H housing
160 vapor deposition station (second electrodes)
170 storage station
180 encapsulation station
280 motor
281 lead screw shaft
281a shaft seal
282 lead screw
283 lead screw shaft termination bracket
284 glide rail bracket(s)
285 glide rail
286 glide rail groove
287 lead screw follower
288 glide shoe
289 holder and/or mask frame
290 switch
292 input terminal
301 crystal mass-sensor
401 sensor signal lead
410 sensor signal feedthrough
500 thermal physical vapor deposition apparatus
500VD vapor distributor
500VS vapor source
500VS1 vapor source (1$^{st}$ organic material)
500VS2 vapor source (2$^{nd}$ organic material)
500VS2A modified vapor source (2$^{nd}$ organic material)
500VS2B modified vapor source (2$^{nd}$ organic material)
500VS3 vapor source (3$^{rd}$ organic material)
500VS4 vapor source (4$^{th}$ organic material)
500VS(m) modified vapor source
500VT vapor transport device
501 tubular wall
502 end cap
503 end cap
504 cavity
505 vapor efflux apertures
506 distributor heat lamp
507 lead
507a feedthrough
509 lead
509a feedthrough
510 distributor lamp power supply
511 regulator
514 heat shield
521a lower portion of vapor transport conduit
521b upper portion of vapor transport conduit
521c vapor distributor seal(s)
522 valve
522a valve stem
522b valve handle
522c valve seal(s)
523 source retainer flange
523a source retainer flange arm
523b source retainer flange arm
523c retainer flange seal
524 source-retaining tension spring(s)
524a source-retaining tension spring
524b source-retaining tension spring
525 source retainer
526 source cover
526A source cover
526B electrically conductive source cover
526c source cover seal
526(m) modified metal source cover
528 source cover gasket
530 thermally insulative plate
532 gasket
534 thermally insulative bushing
536 bushing gasket
540 thermally and electrically insulative container
540A electrically insulative and thermally conductive container
540B electrically conductive container
540C metal container
541 container flange
542 container gasket
542A container gasket
542B container gasket
542C metal gasket
543 compression ridges(s) (in flange 541)
544 compression ridges(s) (in flange 526(m))
546 bolt(s)
548 nut(s)
550 vaporization heater
550i immersion vaporization heater
552 vaporization heater opening
553 feedthrough
554 feedthrough
556 electrical connecting flange
558 electrical connecting flange
560 heat-reflective coating
570 vaporization heating coil
572 heat shield
574 heat-reflective surface 580 vaporization induction-heating coil
584 baffle member
586 baffle support(s)
590 source support plate
592 source-retaining compression spring
594 source-retaining compression spring
620 source power supply (for 500VS(m))
621 regulator
622 lead
623 current meter
624 lead
630 source power supply (for 500VS1)
631 regulator
632 lead
633 current meter
634 lead
650 source power supply (for 500VS2)
650A source power supply (for 500VS2A)
650B induction heater power supply (for 500VS2B)
651 regulator
651A regulator
651B regulator
652 lead
652A current meter
653 current meter
653A current meter
653B current meter
654 lead
666 connecting clamp
668 connecting clamp
670 source power supply (for 500VS3)
671 regulator
672 lead
673 current meter
674 lead
690 source power supply (for 500VS4)
691 regulator
692 lead
693 current meter
694 lead
700 vapor transport device heater power supply
701 regulator
702 lead
703 current meter
704 lead
705 connector
707 connector
710 heat shield
712 heat-reflective surface
720 heating coil
800 vapor transport device heat lamp power supply
801 regulator
802 lamp lead
803 current meter
804 lamp lead
806 lamp connecting lead
810 heat lamp
812 heat reflector
814 reflector mounting bracket
820 heat lamp
822 heat reflector
824 reflector mounting bracket
900 heatable enclosure
910 heating element(s)
920 enclosure support
C chamber
CL center line of vapor distributor (500VD)
D spacing between structure (11) and vapor efflux apertures (505)
d diameter of apertures (505)
f,23 organic layer being formed (from vapors provided by 500VS2 and 500VS3)
l spacing between apertures (505)
$P_C$ reduced pressure in chamber (C)
$P_V$ vapor pressure of organic material vapor(s) in cavity (504)
VC vapor cloud in cavity (504)
v,2 vapor stream in chamber (provided by 500VS2)
v,23 vapor stream in chamber (provided by 500VS2 and 500VS3))
$T_e$ temperature within enclosure (900)
"F" forward motion of substrate or structure (11)
"T" reverse or return motion of substrate or structure
"I" starting position of substrate or structure
"II" intermediate vapor deposition position of substrate or structure
"III" end position of forward motion and beginning position of reverse motion of substrate or structure

What is claimed is:

1. A thermal physical vapor deposition apparatus for vaporizing solid organic materials and applying vaporized organic materials as an organic layer onto structure in a chamber at reduced pressure in forming a part of an organic light-emitting device (OLED), comprising:

a) an elongated vapor distributor disposed in the chamber and spaced from the structure, the vapor distributor defining an elongated cavity having a plurality of vapor efflux apertures formed along an elongated direction of the distributor for delivering vaporized organic materials in the space between the distributor and the structure for depositing an organic layer onto the structure;

b) one or more detachable organic material vapor sources which are disposed outside of the chamber and can be attached, and when operative, to deliver vaporized organic materials into the cavity of the vapor distributor; and c) a vapor transport device dedicated to each of the one or more organic material vapor sources and sealingly extending into the cavity, the vapor transport device including means for detaching or for sealingly attaching an organic material vapor source.

2. The thermal physical vapor deposition apparatus of claim 1 further including a valve disposed in the vapor transport device which is effective in a closed position prior to detaching a vapor source and which is effective in an open position upon attaching the vapor source so that the reduced pressure in the chamber is maintained whenever one or more organic material vapor sources are detached from or attached to the vapor transport device.

3. The thermal physical vapor deposition apparatus of claim 1 wherein the means for detaching or for sealingly attaching an organic material vapor source from or to the vapor transport device includes:
   i) a source retainer flange disposed on the vapor transport device and having flange arms extending outwardly therefrom;
   ii) a source retainer positioned across an outer bottom surface of the vapor source; and
   iii) source-retaining tension springs connecting the flange arms with the source retainer.

4. The thermal physical vapor deposition apparatus of claim 1 wherein the means for detaching or for sealingly attaching an organic material vapor source from or to the vapor transport device includes:
   i) a source support plate positioned across an outer bottom surface of the vapor source; and
   ii) at least one source-retaining compression spring disposed between the support plate and a stationary support surface.

5. The thermal physical vapor deposition apparatus of claim 1 further including:
   i) means for heating each of the one or more organic material vapor sources to a vaporization temperature which causes at least a portion of solid organic material received in the vapor source(s) to vaporize;
   ii) means for heating each vapor transport device to a temperature sufficient to effect vapor transport from a corresponding vapor source to the cavity of the elongated vapor distributor; and
   iii) means for heating the cavity of the vapor distributor to a temperature sufficient to effect delivery or vaporized organic material(s) from the cavity through the plurality of vapor efflux apertures to the space between the distributor and the structure.

6. The thermal physical vapor deposition apparatus of claim 5 wherein each of the one or more organic material vapor sources includes a container for receiving a solid organic material which can be vaporized, and the vapor transport device includes a cover sealingly connected thereto, the cover sealingly engaging an upper surface of the container when the container is attached to the vapor transport device.

7. The thermal physical vapor deposition apparatus of claim 6 wherein the means for heating each of the one or more organic material vapor sources includes a substantially planar heater sealingly disposed between the upper surface of the container and the cover, and the container includes a heat-reflective coating formed over at least a portion of surfaces of the container.

8. The thermal physical vapor deposition apparatus of claim 6 wherein the means for heating each of the one or more organic material vapor sources includes a heating coil disposed along outer side wall surfaces of the container, or an induction heating coil disposed proximate outer side wall surfaces of an electrically conductive container for inductively heating the container.

9. The thermal physical vapor deposition apparatus of claim 5 wherein the means for heating the vapor transport device includes a heating coil disposed along outer surfaces of the device, or one or more heat lamps for directing heat radiation towards the vapor transport device.

10. The thermal physical vapor deposition apparatus of claim 5 wherein the means for heating the cavity of the vapor distributor includes at least one heat lamp disposed in the elongated cavity.

11. The thermal physical vapor deposition apparatus of claim 1 wherein the plurality of vapor efflux apertures are sized and spaced from one another so that a vapor pressure $P_V$ in the cavity of vaporized organic material delivered into the cavity from the one or more organic material vapor sources through a corresponding vapor transport device is greater than a reduced pressure $P_C$ in the chamber.

12. The thermal physical vapor deposition apparatus of claim 1 further including means for moving the structure with respect to the vapor distributor in directions perpendicular to the elongated direction during application of the organic layer to provide a layer of improved uniformity on the structure.

13. A thermal physical vapor deposition apparatus for vaporizing solid organic materials and applying vaporized organic materials as an organic layer onto structure in a chamber at reduced pressure in forming a part of an organic light-emitting device (OLED), comprising:
   a) an elongated vapor distributor disposed in the chamber and spaced from the structure, the vapor distributor defining an elongated cavity having a plurality of vapor efflux apertures formed along an elongated direction of the distributor for delivering vaporized organic materials in the space between the distributor and the structure for depositing an organic layer onto the structure;
   b) a plurality of detachable organic material vapor sources which are disposed outside of the chamber and can be attached, and when operative, to deliver vaporized organic materials into the cavity of the vapor distributor; and
   c) a vapor transport device dedicated to each of the plurality of organic material vapor sources and sealingly extending into the cavity, the vapor transport device including means for detaching or for sealingly attaching an organic material vapor source, and the vapor transport device further including a valve which is effective in a closed position prior to detaching a vapor source and which is effective in an open position upon attaching a vapor source so that the reduced pressure in the chamber is maintained whenever one or more organic material vapor sources are detached from or attached to the vapor transport device.

14. The thermal physical vapor deposition apparatus of claim 13 wherein the means for detaching or for sealingly attaching an organic material vapor source from or to the vapor transport device includes:
   i) a source retainer flange disposed on the vapor transport device and having flange arms extending outwardly therefrom;
   ii) a source retainer positioned across an outer bottom surface of the vapor source; and
   iii) source-retaining tension springs connecting the flange arms with the source retainer.

15. The thermal physical vapor deposition apparatus of claim 13 wherein the means for detaching or for sealingly attaching an organic material vapor source from or to the vapor transport device includes:
   i) a source support plate positioned across an outer bottom surface of the vapor source; and
   ii) at least one source-retaining compression spring disposed between the support plate and a stationary support surface.

16. The thermal physical vapor deposition apparatus of claim 13 further including:
   i) means for heating each one of the plurality of organic material vapor sources to a vaporization temperature which causes at least a portion of solid organic material received in the vapor source(s) to vaporize;
   ii) means for heating each vapor transport device to a temperature sufficient to effect vapor transport from a corresponding vapor source to the cavity of the elongated vapor distributor; and
   iii) means for heating the cavity of the vapor distributor to a temperature sufficient to effect delivery or vaporized organic material(s) from the cavity through the plurality of vapor efflux apertures to the space between the distributor and the structure.

17. The thermal physical vapor deposition apparatus of claim 16 wherein each one of the plurality of organic material vapor sources includes a container for receiving a solid organic material which can be vaporized, and the vapor transport device includes a cover sealingly connected thereto, the cover sealingly engaging an upper surface of the container when the container is attached to the vapor transport device.

18. The thermal physical vapor deposition apparatus of claim 17 wherein the means for heating each one of the plurality of organic material vapor sources includes a substantially planar heater sealingly disposed between the upper surface of the container and the cover, and the container includes a heat-reflective coating formed over at least a portion of surfaces of the container.

19. The thermal physical vapor deposition apparatus of claim 17 wherein the means for heating each one of the plurality of organic material vapor sources includes a heating coil disposed along outer side wall surfaces of the container, or an induction heating coil disposed proximate outer side wall surfaces of an electrically conductive container for inductively heating the container.

20. The thermal physical vapor deposition apparatus of claim 17 wherein the solid organic material received in one or more of the containers includes powder, flakes, particulates, or one or more solid pellets of such organic material.

21. The thermal physical vapor deposition apparatus of claim 20 wherein the solid organic material received in one or more of the containers includes one or more organic host materials.

22. The thermal physical vapor deposition apparatus of claim 21 wherein the one or more organic host materials include organic hole-injecting host materials, organic hole-transporting host materials, organic light-emitting host materials, or organic electron-transporting host materials.

23. The thermal physical vapor deposition apparatus of claim 20 wherein the solid organic material received in one or more of the containers includes one or more organic dopant materials.

24. The thermal physical vapor deposition apparatus of claim 23 wherein the one or more organic dopant materials include color-neutral organic dopant materials, or color-modifying organic dopant materials.

25. The thermal physical vapor deposition apparatus of claim 16 wherein the means for heating the vapor transport device includes a heating coil disposed along outer surfaces of the device, or one or more heat lamps for directing heat radiation towards the vapor transport device.

26. The thermal physical vapor deposition apparatus of claim 16 wherein the means for heating the cavity of the vapor distributor includes at least one heat lamp disposed in the elongated cavity.

27. The thermal physical vapor deposition apparatus of claim 13 wherein the plurality of vapor efflux apertures are sized and spaced from one another so that a vapor pressure $P_V$ in the cavity of vaporized organic material delivered into the cavity from each one of the plurality of organic material vapor sources through a corresponding vapor transport device is greater than a reduced pressure $P_C$ in the chamber.

28. The thermal physical vapor deposition apparatus of claim 13 further including means for moving the structure with respect to the vapor distributor in directions perpendicular to the elongated direction during application of the organic layer to provide a layer of improved uniformity on the structure.

29. The thermal physical vapor deposition apparatus of claim 1 wherein the means for detaching or for sealingly attaching an organic material vapor source from or to the vapor transport device includes:
   i) a metal container for receiving a solid organic material which can be vaporized, the metal container including a container flange;
   ii) a metal cover for covering the container and the container flange, the metal cover forming a part of the vapor transport device;
   iii) a compressible metal gasket positioned between the container flange and the metal cover; and
   iv) means for compressing at least a portion of the metal gasket to provide a sealing engagement between the container and the cover, such means for compressing being reversible for detaching the container from the cover.

30. The thermal physical vapor deposition apparatus of claim 29 further including:
   i) an immersion vaporization heater extending through the metal cover into the solid organic material received in the metal container and heated to a vaporization temperature which causes at least a portion of solid organic material to vaporize; and
   ii) a heatable enclosure for enclosing the organic material vapor source and the vapor transport device, the enclosure being heated to provide a temperature within the enclosure which is insufficient to cause vaporization of organic material received in the container, and which is sufficient to prevent condensation of organic material vapors on inside surfaces of the vapor source and the vapor transport device.

31. A method of making an organic layer on a structure in a chamber at reduced pressure in forming a part of an organic light-emitting device (OLED), comprising the steps of:
   a) positioning an elongated vapor distributor in the chamber and spaced from the structure, and defining a plurality of vapor efflux apertures along an elongated direction of the distributor facing the structure;
   b) providing one or more detachable organic material vapor sources disposed outside of the chamber which can be attached, and when operative, to deliver vaporized organic materials; and c) operatively connecting a vapor transport device between the vapor distributor and each of the one or more vapor sources.

32. The method of claim 31 further including moving the structure with respect to the vapor distributor during vapor deposition of an organic layer on the structure.

33. The method of claim 31 further including sealingly attaching a detached vapor source to the vapor transport device by using tension springs or compression springs.

34. The method of claim 31 further including heating each of the one or more attached vapor sources to vaporize at least a portion of solid organic material(s) received therein, heating each corresponding vapor transport device, and heating the elongated vapor distributor.

35. The method of claim 31 further including providing a valve in the vapor transport device.

36. The method of claim 35 further including closing the valve prior to detaching a vapor source from the vapor transport device, and opening the valve upon attaching a vapor source to the vapor transport device.

* * * * *